(12) United States Patent
West

(10) Patent No.: US 11,580,273 B2
(45) Date of Patent: Feb. 14, 2023

(54) REAL-TIME SYSTEM AND METHOD FOR CALIBRATING A WATER DISTRIBUTION NETWORK HYDRAULIC MODEL

(71) Applicant: Jonathan Paul West, Decatur, GA (US)

(72) Inventor: Jonathan Paul West, Decatur, GA (US)

( * ) Notice: Subject to any disclaimer, the term of this patent is extended or adjusted under 35 U.S.C. 154(b) by 0 days.

(21) Appl. No.: 16/896,158

(22) Filed: Jun. 8, 2020

(65) Prior Publication Data

US 2020/0387648 A1      Dec. 10, 2020

Related U.S. Application Data

(60) Provisional application No. 62/858,834, filed on Jun. 7, 2019.

(51) Int. Cl.
| | |
|---|---|
| *G06F 30/17* | (2020.01) |
| *G06F 30/20* | (2020.01) |
| *G06N 20/00* | (2019.01) |
| *H02J 3/00* | (2006.01) |
| *E03B 7/02* | (2006.01) |

(52) U.S. Cl.
CPC ............... *G06F 30/17* (2020.01); *E03B 7/02* (2013.01); *G06F 30/20* (2020.01); *G06N 20/00* (2019.01); *H02J 3/004* (2020.01); *H02J 2300/24* (2020.01)

(58) Field of Classification Search
CPC .......... G06F 30/17; G06F 30/20; H02J 3/004; E03B 7/02
USPC .......................................................... 703/7
See application file for complete search history.

(56) References Cited

U.S. PATENT DOCUMENTS

| | | | |
|---|---|---|---|
| 4,562,552 A | 12/1985 | Miyaoka et al. | |
| 7,457,735 B2* | 11/2008 | Wu .................. | G06N 3/126 |
| | | | 702/85 |
| 10,387,590 B2 | 8/2019 | Ba et al. | |
| 10,657,299 B2 | 5/2020 | Fusco et al. | |
| 10,663,933 B2 | 5/2020 | Rasekh et al. | |
| 2009/0150001 A1* | 6/2009 | Fekete ............... | G05B 15/02 |
| | | | 700/284 |
| 2011/0191267 A1 | 8/2011 | Savic et al. | |
| 2014/0052421 A1 | 2/2014 | Allen et al. | |
| 2017/0103149 A1* | 4/2017 | Ba ..................... | G06Q 10/04 |

(Continued)

OTHER PUBLICATIONS

Ormsbee et al. (Calibration of Hydraulic Network Models, (28 pages) (Year: 1997).*

*Primary Examiner* — Andre Pierre Louis
(74) *Attorney, Agent, or Firm* — Richard C. Piercy; Grell & Watson Patent Attorneys LLC

(57) ABSTRACT

Ultra-high accuracy elevation and pressure telemetry devices are used to develop an autonomous, self-calibrating hydraulic piping network computer simulation model. Virtual pressure reducing valve (PRV) model elements force a local downstream calibration of the model using the pressure telemetry data, overcoming the potential ill conditioned state when simulating wide ranging, real world operational conditions. This technique also creates a smaller solution set for calibration optimization algorithms such as machine learning. Additional benefits of this technique include the ability to ignore complex facilities such as pump stations, water storage tanks, and control valves enabling a more rapid development of the real-time water piping network computer simulation model.

20 Claims, 16 Drawing Sheets

(56) References Cited

U.S. PATENT DOCUMENTS

2017/0370893 A1* 12/2017 West ...................... E03B 7/072
2018/0148910 A1* 5/2018 Larouche ................. E03B 9/04

* cited by examiner

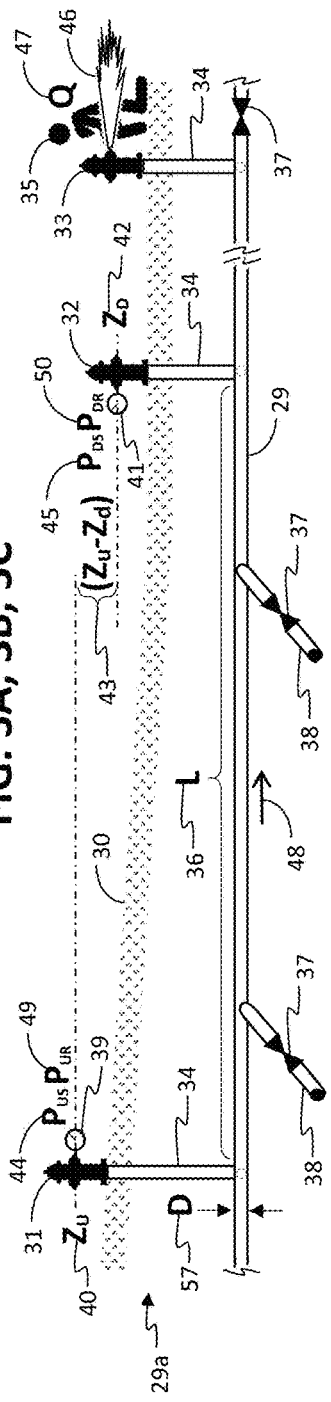
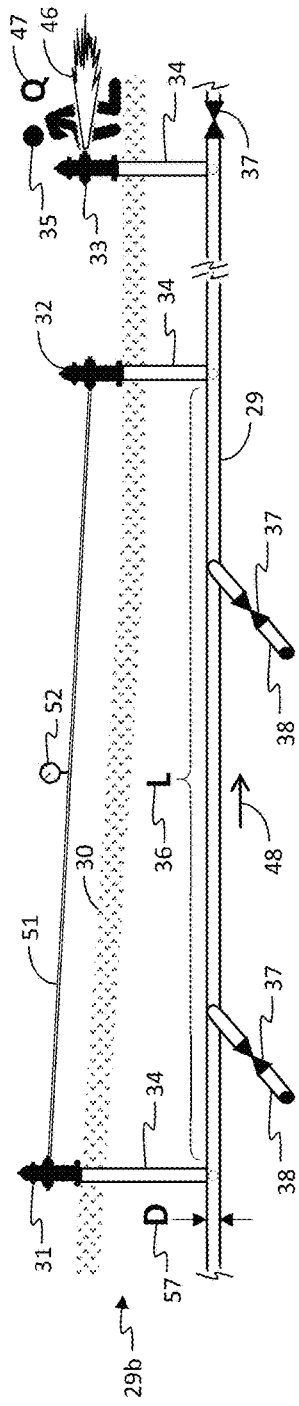
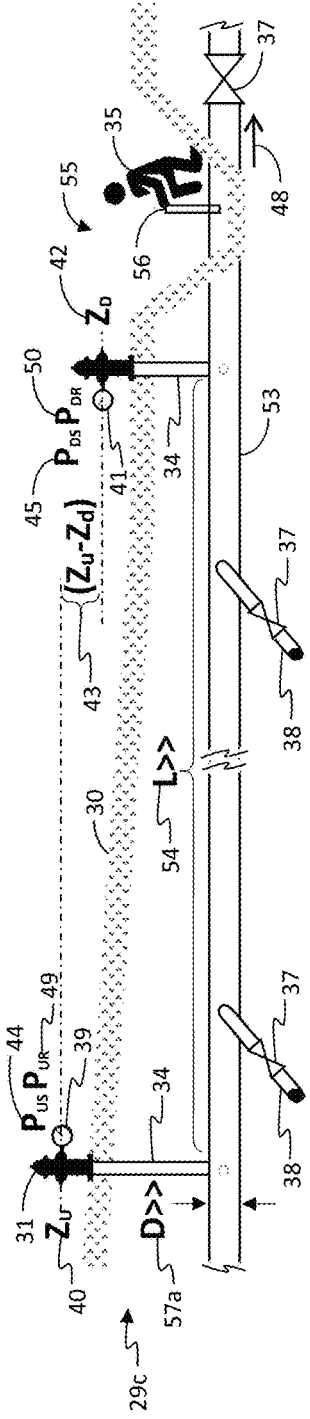
FIG. 3A: Two Gauge Method C-Factor Test for Small Water Mains
FIG. 3B: Parallel Hose Method C-Factor Test for Small Water Mains
FIG. 3C: Two-Gauge Method C-Factor Test for Large Water Mains

FIG. 3D $$C = (10.44 \times L \times Q^{1.852} / H_{LP} \times D^{4.87})^{1/1.852}$$

Where,

C = Pipe Internal Roughness Coefficient (Hazen-William)

L = Pipe Test Section Length in Feet; (ex. 10,560')

Q = Pipe Flowrate in Gallons Per Minute; (ex. 2,100 gpm)

$H_{LP}$ = Pipe Headloss in Feet $H_2O$ = 2.31*(($(P_{UR}-P_{DR})-(P_{US}-P_{DS})$); (ex. 3.5')

D = Pipe Internal Diameter in Inches; (ex. 24")

$$C = \{[(10.44)(10,560')(2,100 \text{gpm}^{1.852})] / [(3.5')(24"^{4.87})]\}^{0.5399} = 133$$

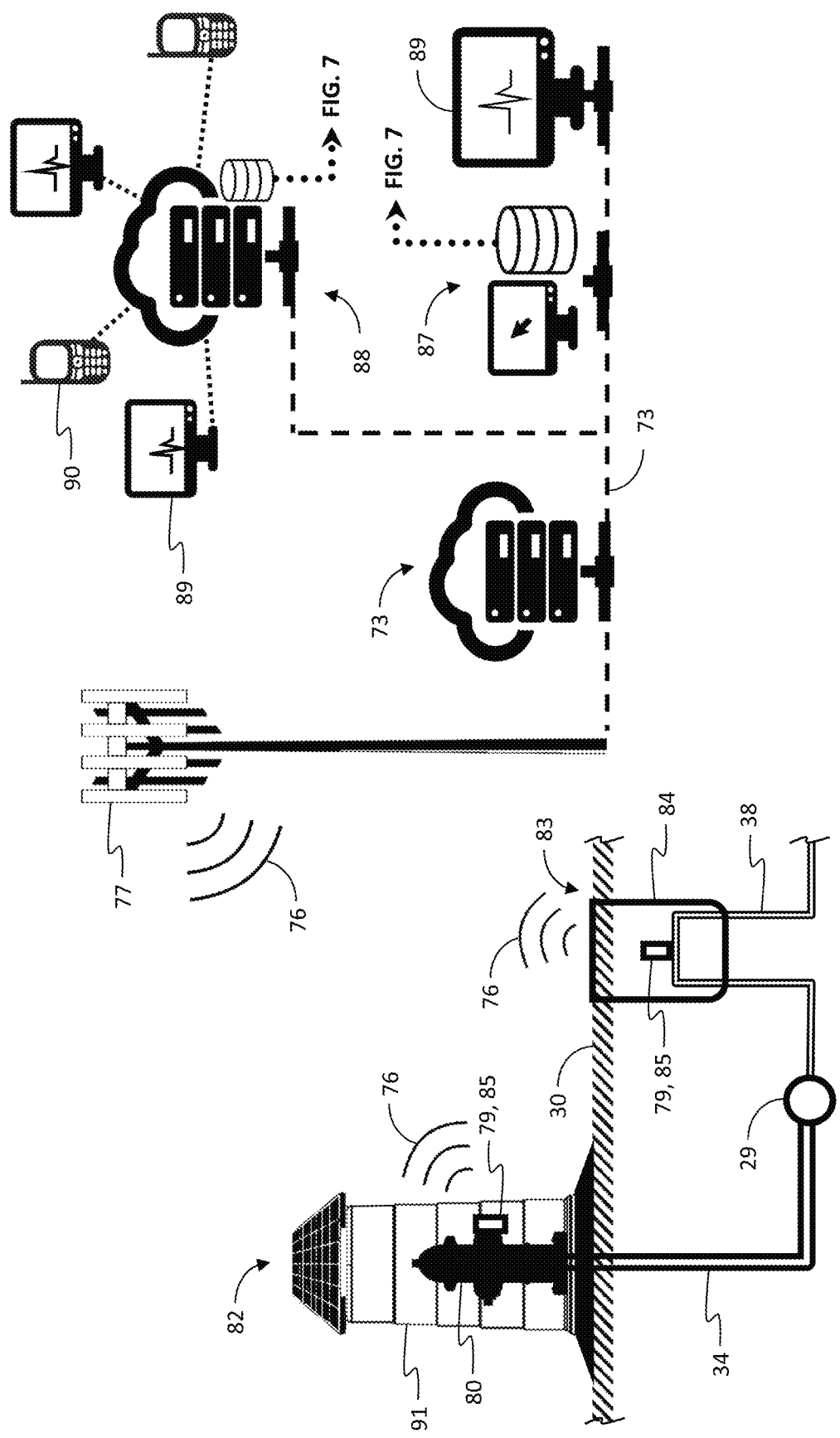

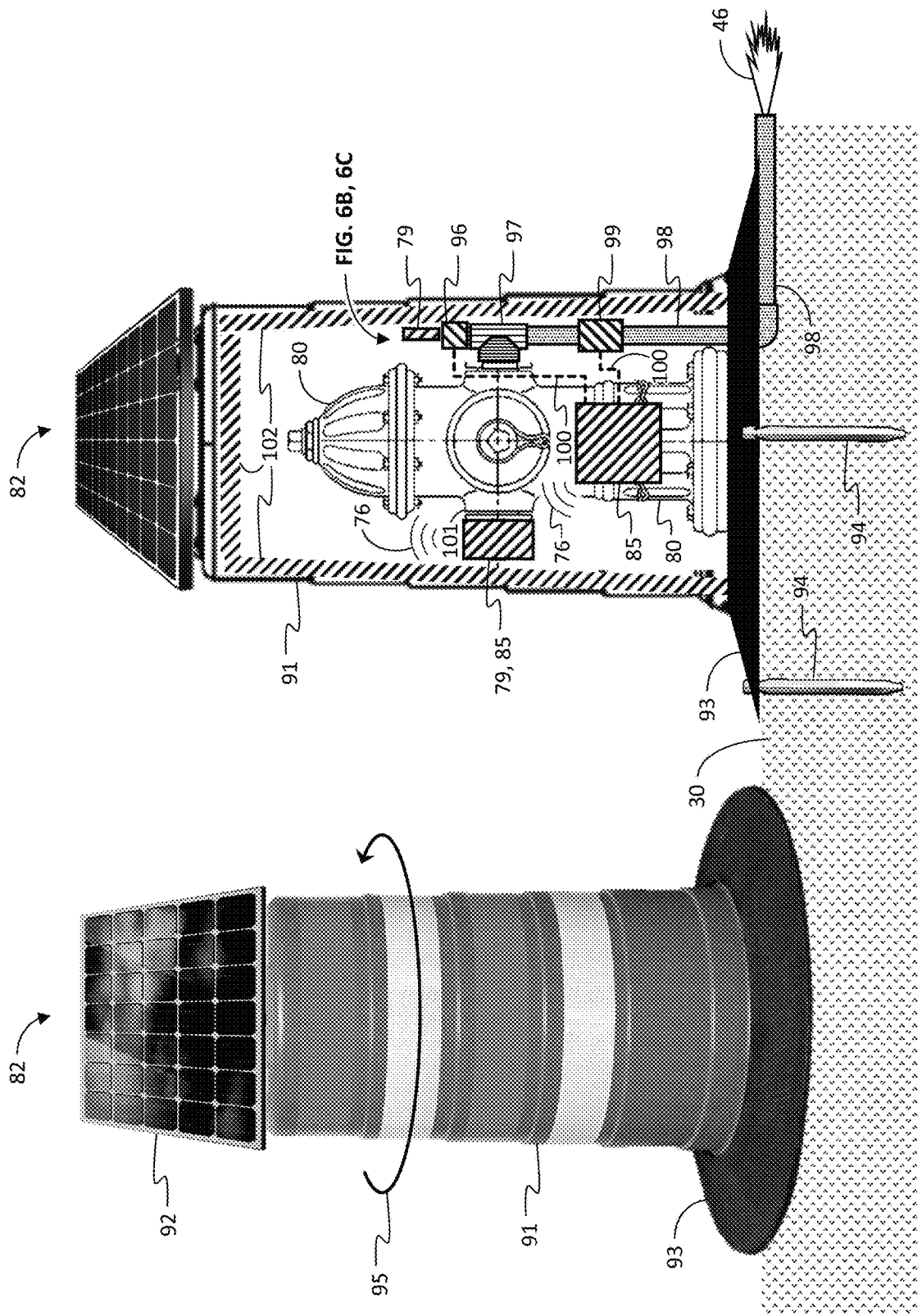

FIG. 7A, 7B, and 7C
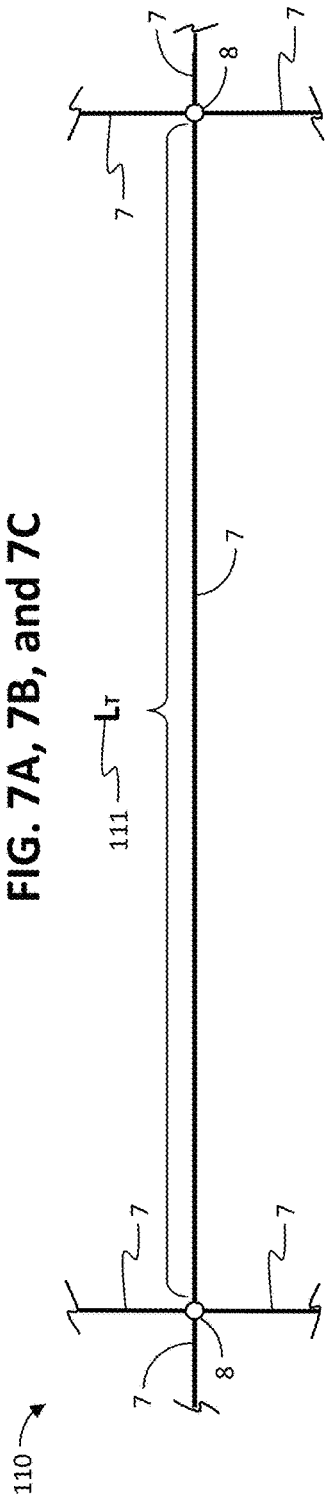
FIG. 7A (Prior Art): Typical Pipe and Junction Elements in Network Model
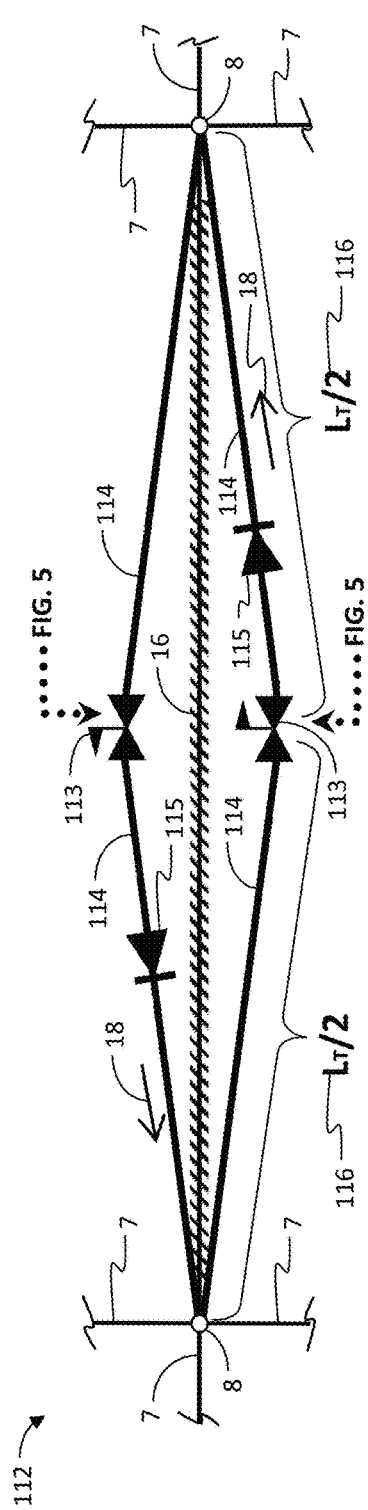
FIG. 7B (New Art): Opposing Virtual PRV Model Elements Controlled by Pressure Telemetry Time Series Pattern
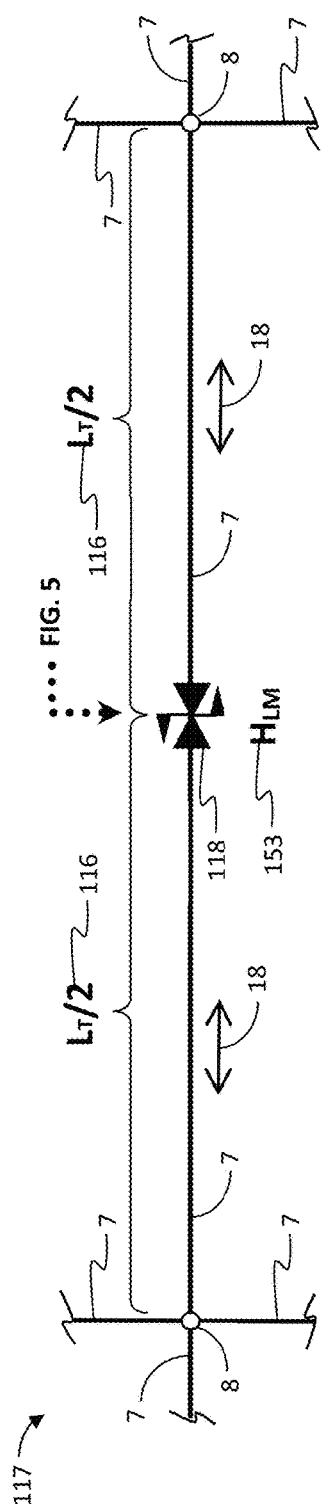
FIG. 7C (New Art): Bi-directional Virtual PRV Model Element Controlled by Pressure Telemetry Time Series Pattern FIG. 8A (Prior Art): Sequence A – Traditional Hydraulic Model Preparation for Single Event Manual Calibration Effort FIG. 8B (New Art): Sequence B – Simplified Model Preparation for Automatic and Continuous Calibration System

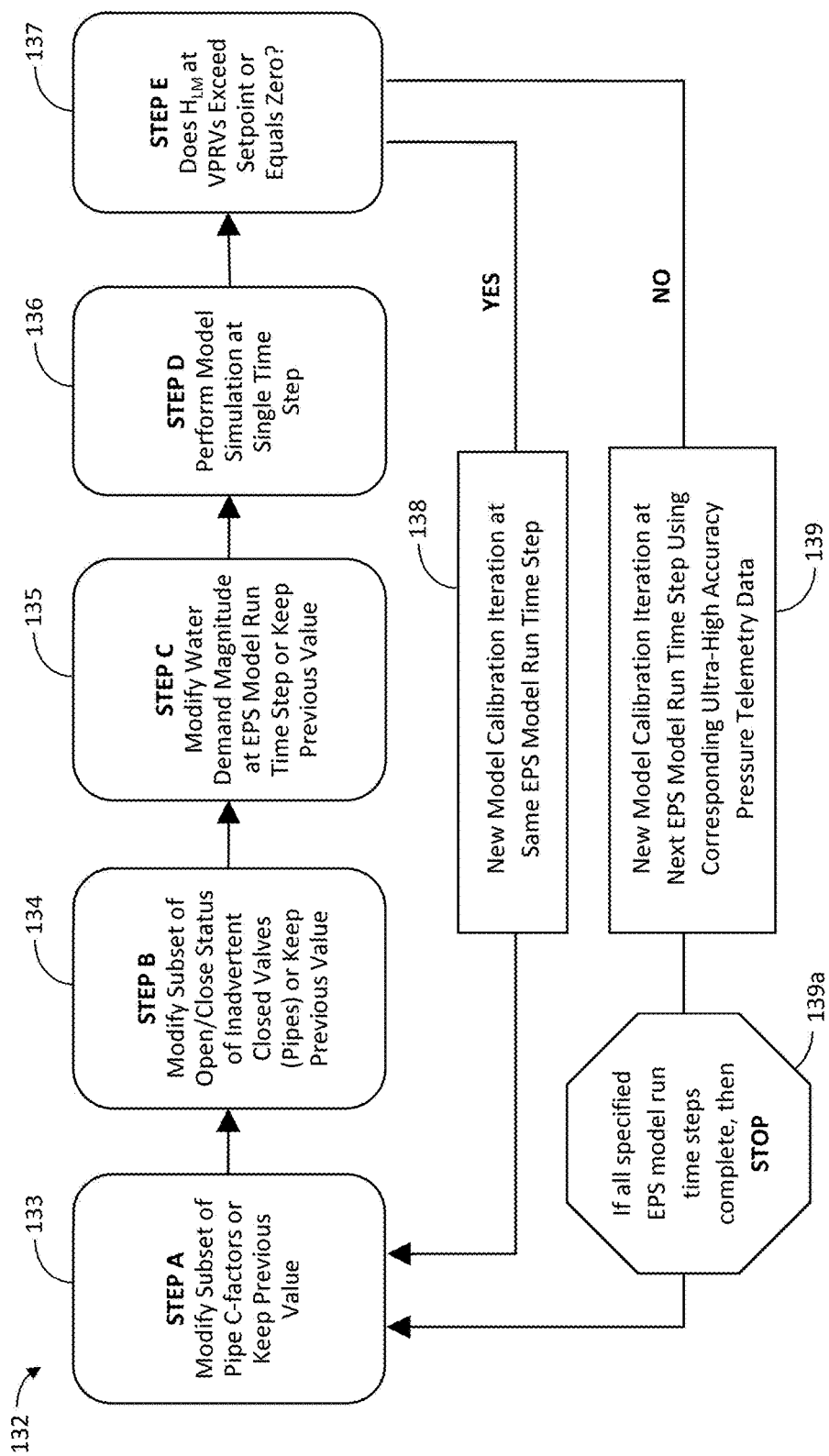
FIG. 8C: Sequence B Continued - Near Real Time Automatic and Continuous Calibration of Water Distribution System Network Computer Model

REAL-TIME SYSTEM AND METHOD FOR CALIBRATING A WATER DISTRIBUTION NETWORK HYDRAULIC MODEL

CROSS-REFERENCE TO RELATED APPLICATIONS

To the full extent permitted by law, the present United States Non-provisional Patent Application hereby claims priority to and the full benefit of, United States Provisional Application entitled "UNIVERSAL AUTOMATIC SELF-CALIBRATING WATER DISTRIBUTION SYSTEM NETWORK MODEL," having assigned Ser. No. 62/858,834, filed on Jun. 7, 2019, which is incorporated herein by reference in its entirety.

FEDERALLY SPONSORED RESEARCH OR DEVELOPMENT

None

PARTIES TO A JOINT RESEARCH AGREEMENT

None

REFERENCE TO A SEQUENCE LISTING

None

BACKGROUND OF THE DISCLOSURE

Technical Field of the Disclosure

The invention relates to the calibration of real-time hydraulic and water quality computational simulation models of municipal and private water distribution, sewer collection and stormwater piping networks.

Description of the Related Art

Water distribution networks deliver potable water from treatment plants to customer homes, businesses, and industry through miles of buried pipelines, pumping stations, storage tanks, and control valve facilities. Hydraulic network computer simulation models (hydraulic models) are important tools used by water engineers to perform operational, design, and long-range planning studies. However, calibrating hydraulic models to real-world flow, pressure, level, and water quality field conditions is an extremely complex, time consuming, costly, and a challenging process even for seasoned professional engineers. Due to the variations and complexities of these systems, many water utilities may only calibrate their hydraulic model once every 5-10 years, which leads to a lack of confidence in the tool and missed operational and capital savings opportunities. Other water distribution networks may deliver non-potable water to various destinations. These systems include but are not limited to sanitary or non-sanitary stormwater distribution systems, sewage distribution systems or network of sewers, the like and/or combinations thereof, where appropriate.

Linking data from Supervisory Control and Data Acquisition (SCADA) systems or Internet of Things (IoT) devices to create a near real-time hydraulic water distribution network model is considered a pinnacle achievement in the water utility industry and provides many operational and engineering benefits. However, less than 0.1% of water utilities in the United States have achieved this goal even though the technology has existed more than a decade. This lack of technology adoption may be due to many reasons: limited environmental regulation, the overwhelming complexity of municipal buried water infrastructure systems, coordination among engineering disciplines, different sales and project implementation cycles between SCADA capital projects and network modeling studies, the complexity of public/private contract relationships, or simply the general lack of funding, knowledge, and technical resources.

Real-time hydraulic models traditionally depend on sensor data from SCADA systems. However, security concerns have resulted in cyber defense strategies such as air gaps between the SCADA system and the corporate local area network (LAN) or internet, thus limiting access and ability to integrate SCADA historians with the hydraulic computer models.

SCADA systems allow remote monitoring and control of water conveyance facilities such as pump stations, water storage tanks, and control valve stations, but large areas within a water, wastewater, or stormwater network typically lack any remote telemetry stations leading to a lack of important operational information. A small percentage of water utilities are adopting advanced metering infrastructure (AMI), where tens of thousands of customers water meters report wirelessly to a central IT server. AMI can provide a rich source of customer diurnal water consumption data, but unfortunately, many AMI systems do not condense the individual customer meter data to composite district diurnal demand patterns that can be ingested into commercial modeling software. As an alternative to customer-based AMI, battery-powered internet-of-things (IoT) devices that measure discrete flow or pressure points within the utility piping networks can be used to form district metered areas (DMAs). However, the deployment and integration of SCADA, AMI, and/or discrete IoT monitoring stations to develop real-time hydraulic models results in additional implementation complexity, time, and cost, and thus becomes a deterrent rather than an opportunity Complex facility operational data is typically required to calibrate hydraulic models such as pump station flows, pump station suction and discharge pressures, pump on/off status, pump speeds, water storage tank level, control valve pressure or flow set-points, etc. Likewise, accurate pump "flow-head" curves measured in the field are typically required to ensure the real-time hydraulic model functions properly. Also, field and control room operators sometimes change operational set-point controls, information that is not logged in the SCADA historian or available to the modeler. Likewise, because SCADA systems poll across many remote stations, data gaps sometimes occur. All of these factors create additional challenges implementing and maintaining a traditional real-time hydraulic model.

Another challenge with traditional real-time hydraulic models is that new input data streams from an irregular operational event can place the hydraulic computer model in an ill-conditioned state where the simulation algorithm does not converge, and thus the computer model simulation fails. This happens if the model has not been calibrated to a wide range of operational events which is almost never attempted due to the cost and complexity of manually post processing SCADA data. This complexity leads to a fear by even experienced practitioners to attempt the development of a real-time hydraulic model under a contractual relationship between consultant and utility owner. Likewise, there are hydraulic events that are not captured by telemetry such as a hydrant flow test, fire department usage, water main break, or the thousands of customer billing flow meters, which further complicates managing a traditional real-time hydraulic model.

A large number of water distributions systems have a relatively small amount of topographic relief and thus have not had to utilize pressure control valve stations or booster pumping stations to create dedicated high or low pressure zones. This leads to systems with large areas that lack any SCADA information that could be used for calibrating the hydraulic model, requiring field testing efforts. In some cases, pits are dug to install insertion rod flow meters and pressure dataloggers are deployed on hydrants, some which include telemetry. However, excavation and installation of flow meters is expensive and thus is often omitted from a model development project. According to one aspect of the disclosed subject matter, if a sensor could be designed with such accuracy that it could be installed above ground at a random demarcation of the system, a real-time hydraulic model could be developed for a smaller pilot area thus making the economics for some utilities more acceptable.

For municipal water distribution networks that cover wide geographic areas and topographic relief across counties and cities, modern day light detecting and ranging (LIDAR) technology provides municipalities with very useful ground elevation data with accuracies of +/−1 foot. While this data accuracy is beneficial to the model in a global sense, it may not be accurate enough to perform some hydraulic measurements with pressure-only sensors. According to one aspect of the disclosed subject matter, if the pressure data were used as a model input (i.e. boundary condition) or for performing a flow measurement using differential pressure across two distant sensors, then a +/−1 foot elevation error would be unacceptable.

Historically, pressure sensors in water distribution systems are required to operate over a wide range, such as 0-150 psi, depending on the location within the water system. Using an industrial grade, high accuracy, pressure transmitter commonly used in the water utility industry, such as a Rosemount Series 3051 (available at www.emerson.com), the factory-calibrated accuracy has a total error band (TEB) of +/−0.1% of span (at best) considering typical climate related temperature fluctuations in a water system. For this instance, the error is estimated to be 150 psi×0.001=0.15 psi (+/−) or 4.16 inches H2O column (+/−) (at the very best with optimal site conditions), and this does not include potential digital to analog conversion errors, long term sensor drift errors if not routinely calibrated, and the effects of barometric pressure changes that impact a gauge-type pressure sensor where one side of the sensor diaphragm is vented to atmosphere. However, the above described accuracy is typically not necessary for a water utility operator or modeling engineer because the sensor is simply being used to indicate performance or calibration acceptance, where a +/−1 to +/−3 psi model vs. field error may be acceptable (Ormsbee, L, and Lingireddy, S., "Calibrating Hydraulic Network Models," Journal of the American Water Works Association*, Vol 89, No. 2, February 1997, pp 42-50). For this reason, the above referenced instrument is rarely calibrated to factory or optimal site conditions such that it becomes unacceptable for use as a boundary condition in a hydraulic model such as a source or sink. Furthermore, according to one aspect of the disclosed subject matter, if multiple pressure sensors were used to estimate flow along a long transmission main, the pressure measurement error of +/−4.16 inches H2O column, plus the elevation error of +/−12 inches, would be too high to achieve a usable flow estimate.

Accordingly, there remains a need for a better system and method for developing real-time hydraulic models, including a singular measurement type and technique to simplify the collection of high accuracy hydraulic measurement data, and a need for a computer modeling technique that overcomes the wide variety of operational variances and complexities. Likewise, the implementation process must be made simple for mass adoption by the water utility industry as made evident by the slow adoption over the past decade using traditional real-time hydraulic modeling approaches.

SUMMARY

According to one aspect of the disclosed subject matter, a system and method that dramatically simplifies the development and accuracy of real-time hydraulic models of water distribution, sewer collection force main, and stormwater pumping networks using ultra-high accuracy hydraulic field measurements and self-adapting hydraulic model elements and a calibration optimization algorithm.

According to one aspect of the disclosed system and method for calibrating a real-time hydraulic model, ultra-high accuracy elevation data is collected using static or real-time kinematic surveying (RTK) using the Global Navigation Satellite System (GNSS) at points in a water distribution network where ultra-high accuracy pressure sensors will be placed. Typical horizontal elevation accuracies of +/−1 inch are attainable in the field using systems such as the Trimble (available at www.trimble.com/) Series R12 GNSS Receiver, which is approximately 10 times more accurate than elevation data traditionally collected using LIDAR.

According to one aspect of the disclosed system and method for calibrating a real-time hydraulic model, ultra-high accuracy pressure sensors, which are normally used in a lab setting as a calibration reference sensor, are placed at strategic points within a water distribution network: 1) to estimate flow by measuring small pressure drops along a pipeline using a known or approximate pipe internal roughness (Hazen Williams C-factor coefficient), and 2) to accurately determine the pressure at each sensor site in order to control the hydraulic gradient in the hydraulic model using a virtual pressure reducing valve (PRV) model element. A commercial example of a lab grade, ultra-high accuracy pressure sensor and digital transmitter is made by Keller (available at keller-druck.com/) Series 33X with total error band (TEB) of approximately +/−0.01% (utilizing RS-485 protocol), which in contrast is approximately 10 times more accurate than a Rosemount 3051 Series commonly used in the water utility industry, if maintained and routinely calibrated.

According to one aspect of the disclosed system and method for calibrating a real-time hydraulic model, virtual pressure reducing valves (PRVs), which do not exist in the real water distribution network, are placed in the hydraulic model at points representing the sensor/telemetry sites and use the time series pressure data to force the downstream hydraulic gradient in the model to match the field sensor values. This technique helps prevent the potential ill-conditioned state of a hydraulic model that can result in simulation failure when new operational events occur in the field which are not captured by SCADA or other telemetry systems such as a pipe break, hydrant flushing, or a large customer demand event. The forced local calibration using the virtual PRV model elements also provides a better starting point for iterative search algorithms, such as machine learning, that develop potential calibration solution sets, thereby identifying and reducing errors and/or discrepancies of the overall simulation when expected and/or calculated measurements do not align with measurements obtained via telemetry.

The ultra-high accuracy pressure sensor is fitted with a 3-port, 2-way latching solenoid which can be opened and closed remotely using remote telemetry commands to vent the sensor port to atmospheric pressure to perform a "zero" calibration adjustment. This technique helps mitigate the most common source of pressure sensor error which is "zero" drift, a phenomenon that is more prevalent in new sensors.

According to one aspect of the disclosed system and method for calibrating a real-time hydraulic model, the ultra-high accuracy sensor is an absolute-type, meaning the back side of the sensor diaphragm is sealed with an induced vacuum pressure making it immune to changes in atmospheric pressure, as opposed to the more commonly used gauge-type pressure sensor which has an internal port exposed to the atmosphere.

According to one aspect of the disclosed system and method for calibrating a real-time hydraulic model, using ultra-high accuracy elevation data and ultra-high accuracy pressure telemetry allows the modeler to temporarily or permanently ignore complicated pump stations and water storage tanks using a deactivation feature in the model. This technique greatly simplifies the technical complexities of developing a real-time hydraulic model. In commercial modeling software with scenario management features, these facilities can be left activate in separate scenarios that serve other analyses and business purposes at the water utility.

According to one aspect of the disclosed system and method for calibrating a real-time hydraulic model, the virtual PRVs can be placed strategically in the system to form a downstream virtual pressure zone (VPZ). If the total water demand in the VPZ area is lower in the model than in the field, the hydraulic model simulation will result in a pressure loss across the virtual PRV to compensate for the discrepancy between the model and field condition. By iteratively increasing the model demand, the pressure loss across the PRV can be reduced below a designated setpoint, thus achieving a desired level of model calibration. On the other hand, if the total water demand in the VPZ area is higher in the model than in the field, the hydraulic model simulation will result in a zero pressure loss across the virtual PRV because it opens fully during the simulation. By iteratively decreasing the model demand, a small pressure loss across the PRV will ultimately occur indicating an acceptable calibration. In addition, the software user can also include additional calibration input adjustments such as varying the pipe internal roughness (Hazen-Williams C-factor coefficients) and the open/close status of pipes to identify inadvertent closed valves in the field.

According to one aspect of the disclosed system and method for calibrating a real-time hydraulic model, the calibration process can be automated using a machine learning algorithm by iteratively varying a combination of inputs including: water demands, pipe C-factors, and pipe open/close status until the virtual PRVs pressure loss increases above zero or drop below a target setpoint.

According to one aspect of the disclosed system and method for calibrating a real-time hydraulic model, field operations staff can induce high flow events to stress the water distribution system such as filling a water storage tank or flowing a fire hydrant in order to achieve a larger pressure drop across the virtual PRVs which provides higher resolution of field anomalies and ultimately a higher accuracy calibration of the hydraulic model. For instance, by utilizing a pitot flow meter diffuser with telemetry for hydrant flushing and fire flow testing, the flow telemetry data can be manually or automatically accounted for during the VPZ model demand calibration adjustment.

BRIEF DESCRIPTION OF THE DRAWINGS

The foregoing summary, as well as the following detailed descriptions of preferred embodiments, is better understood when read in conjunction with the appended drawings. For the purposes of illustration, there is shown in the drawings exemplary embodiments; however, the presently disclosed subject matter is not limited to the specific methods and instrumentalities disclosed. In the drawings:

FIGS. 3A, 3B, and 3C represent prior art showing profile views of three types of Hazen-Williams pipe internal roughness coefficient (C-factor) hydraulic field tests performed on sections of buried pipe in a water distribution system.

FIG. 3A illustrates the two-gauge and hydrant flow test method used on a relatively short section of water main pipe.

FIG. 3B illustrates the parallel hose and hydrant flow test method used on relatively short sections of water main pipe to achieve higher accuracy.

FIG. 3C illustrates the two-gauge and insertion flow meter test method used on relatively long sections or large diameter water main pipe.

FIG. 3D represents prior art showing the Hazen-Williams pipe internal roughness coefficient (C-factor) equation and example calculation illustrating a typical low pressure drop that occurs across the pipeline which is difficult to measure accurately using prior art.

FIG. 5 is an elevation and schematic view illustrating the ultra-high accuracy measurement of water characteristics at above-ground and below-ground water infrastructure components using data acquisition devices, illustrating the wireless communication pathway from the devices of the present disclosure to remote server, database, a hydraulic network computer modeling software, and human machine interface (HMI), in accordance with the present disclosure.

FIG. 6A is an elevation and section view of an apparatus, in accordance with the present disclosure, including a typical fire hydrant, data acquisition device measuring water characteristics, an enclosure with insulation surrounding the hydrant to reduce temperature extremes that can reduce pressure sensor accuracy, a fixed solar panel and/or photovoltaic power source atop the enclosure, the ability to rotate the enclosure and solar panel together to point toward the sun to maximize solar efficiency, a flushing control valve and evacuation pipe, and a 3-port 2-way solenoid that allows for remote depressurization of the sensor for "zero" calibration adjustment.

FIGS. 7A, 7B, and 7C are plan view schematic diagrams of the basic modeling software pipe and junction elements, in accordance with the present disclosure.

FIG. 7A illustrates prior art, a typical model pipe element intersecting other pipe elements at junction elements.

FIG. 7B, in accordance with the present disclosure, represents pressure sensor telemetry input as virtual pressure reducing valve (PRV) and check valve model elements oriented in opposing directions of flow on parallel pipes.

FIG. 7C, in accordance with the present disclosure, represents the same functionality as FIG. 7B with a single bi-directional virtual PRV model element for receiving pressure sensor telemetry input. The virtual PRV element forces the model calibration to prevent an ill conditioned state, and while initially an inaccurate global calibration, this technique also provides a more accurate starting point for iterative or advanced search algorithms, such as machine learning, that automatically derive calibration solution sets.

FIG. 8C, in accordance with the present disclosure, is a block diagram showing the iterative steps of optimizing the model calibration using either manual or advanced machine learning techniques.

DETAILED DESCRIPTION

Figure 1:
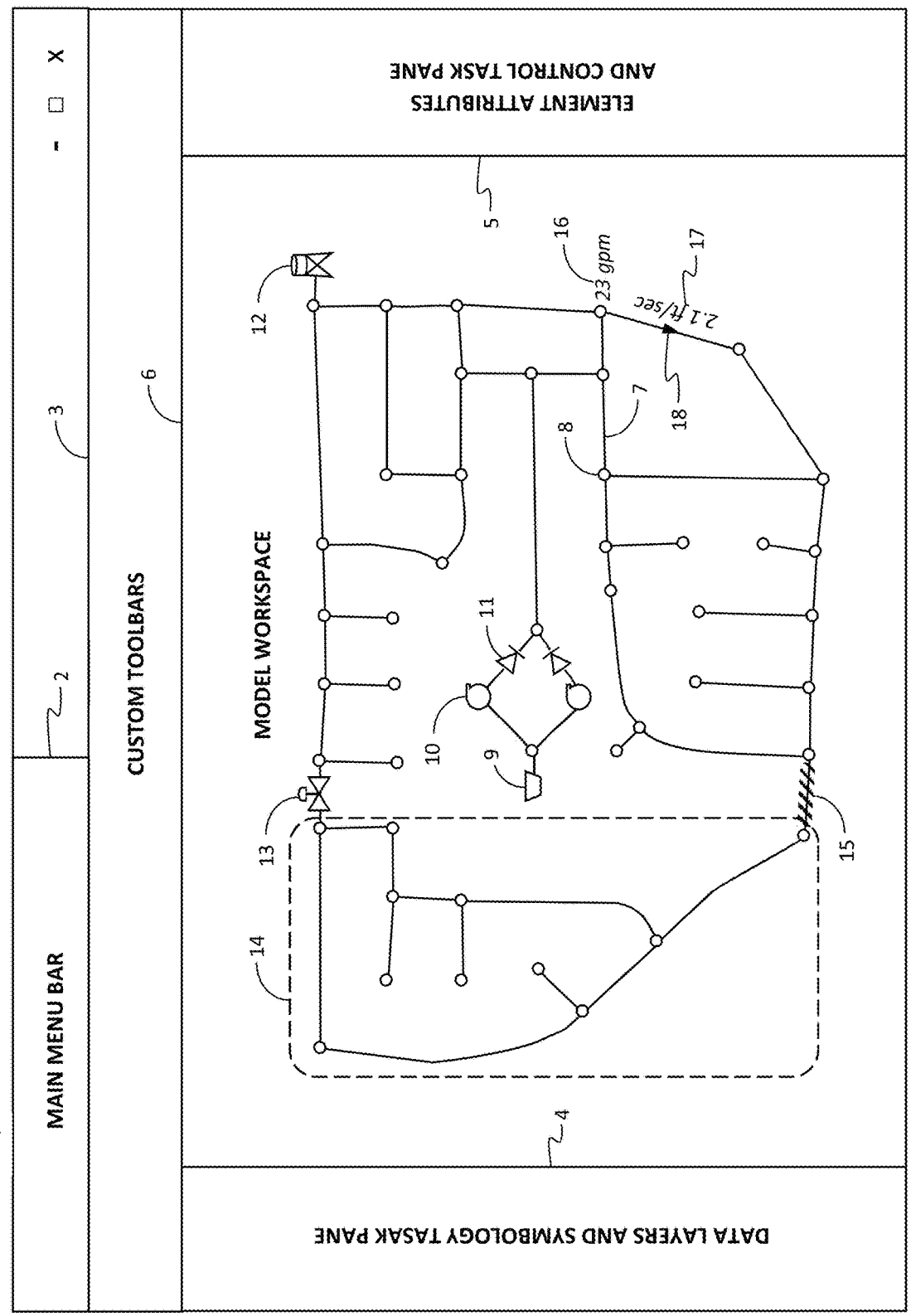
FIG. 1 represents prior art showing a schematic diagram of a computer screen displaying a hydraulic computational software and simulation model representing a water distribution system.

The presently disclosed subject matter now will be described more fully hereinafter with reference to the accompanying drawings, in which some, but not all embodiments are shown. Indeed, this disclosure may be embodied in many different forms and should not be construed as limited to the embodiments set forth herein; rather, these embodiments are provided so that this disclosure will satisfy applicable legal requirements. Like numbers refer to like elements throughout.

When elements are referred to as being "connected" or "coupled", the elements can be directly connected or coupled together, or one or more intervening elements may also be present. In contrast, when elements are referred to as being "directly connected" or "directly coupled," there are no intervening elements present.

The subject matter may be embodied as devices, systems, methods, and/or computer program products. Accordingly, some or all of the subject matter may be embodied in hardware and/or in software (including firmware, resident software, micro-code, state machines, gate arrays, etc.) Furthermore, the subject matter may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be for example, but not limited to, an electronic, magnetic, optical, electromagnetic, infrared, or semiconductor system, apparatus, device, or propagation medium. By way of example, and not limitation, computer-readable media may comprise computer storage media and communication media.

Computer storage media is non-transitory and includes volatile and nonvolatile, removable and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage components, or any other medium or non-transitory computer readable medium which can be used to store the desired information and may be accessed by an instruction execution system. Note that the computer-usable or computer-readable medium can be paper or other suitable medium upon which the program is printed, as the program can be electronically captured via, for instance, optical scanning of the paper or other suitable medium, then compiled, interpreted or otherwise processed in a suitable manner if necessary, and then stored in computer memory.

Communication media typically embodies computer-readable instructions, data structures, program modules or other data in a modulated data signal such as a carrier wave or other transport mechanism and includes any information delivery media. The term "modulated data signal" can be defined as a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above-mentioned should also be included within the scope of computer-readable media. Communication systems, or computing networks, may preferably include one or more user systems, one or more server systems, and network lines or means, which could be, for example, the Internet, public network, private network or cloud. User systems each may preferably include a computer-readable medium, such as random-access memory, coupled to a processor and means to connect to the computing network. A plurality of devices within the computing network, including field devices having a means to communicate to another computing device via a computing network, may transmit, receive, have transmitted, or be in receipt of data in various forms.

When the subject matter is embodied in the general context of computer-executable instructions, the embodiment may comprise program modules, executed by one or more systems, computers, or other devices. Generally, program modules include routines, programs, objects, components, and data structures (and the like) that perform particular tasks or implement particular abstract data types. Typically, the functionality of the program modules may be combined or distributed as desired in various embodiments. Computer programming for implementing the present disclosure may be written in various programming languages, database languages, and the like. However, it is understood that other source or object-oriented programming languages, and other conventional programming language may be utilized without departing from the spirit and intent of the present disclosure. In some embodiments, some or all of the functionality or steps may be performed by a processor of a computing device. In this regard, the example processes and algorithms discussed herein can be performed by at least one processor. Computing devices may be specifically configured to perform and/or execute the various instructions, tasks, requests, transmissions, the like and/or combinations thereof.

Recitation of ranges of values herein are merely intended to serve as a shorthand method of referring individually to each separate value falling within the range, unless otherwise indicated herein; and each separate value is incorporated into the specification as if it were individually recited herein. Therefore, any given numerical range shall include whole and fractions of numbers within the range. For example, the range "1 to 10" shall be interpreted to specifically include whole numbers between 1 and 10 (e.g., 1, 2, 3, . . . 9) and non-whole numbers (e.g., 1.1, 1.2, . . . 1.9).

For the purposes of promoting an understanding of the principles of the present disclosure, reference will now be made to preferred embodiments, and specific language will be used to describe the same. It will nevertheless be understood that no limitation of the scope of the disclosure is thereby intended; such alteration and further modifications of the disclosure, as illustrated herein, is being contemplated as would normally occur to one skilled in the art to which the disclosure relates.

Articles "a" and "an" are used herein to refer to one or to more than one (i.e. at least one) of the grammatical object of the article. By way of example, "an element" means at least one element and can include more than one element.

Field hydraulic network may refer to potable water transmission and distribution systems networks, wastewater collection systems including force main pumping systems, and stormwater pumping system networks.

Unless otherwise defined, all technical terms used herein have the same meaning as commonly understood by one of ordinary skill in the art to which this disclosure belongs.

Prior art of a hydraulic piping network simulation model is shown in FIG. 1, a computer modeling software screen 1 consisting of a main menu bar 2, custom toolbars 3, a data layer and symbology task pane 4, an element attributes and control task pane 5, and the model workspace of a water distribution piping system 6. Within the model workspace are pipe elements 7, junction elements 8, a reservoir element 9 of infinite source or sink, pump elements 10, check valve elements 11, a water storage tank element 12 of finite volume, a pressure reducing valve (PRV) element 13 which solely supplies a lower pressure zone 14, and a deactivated pipe element 15 representing a closed valve which prevents flow, each component or element on the hydraulic piping network simulation model representing a simulated version of a physical counterpart within a physical hydraulic piping network. Junction element annotation 16, pipe element annotation 17, and pipe element flow direction symbology 18, display useful information to one trained in the art.

Figure 2:
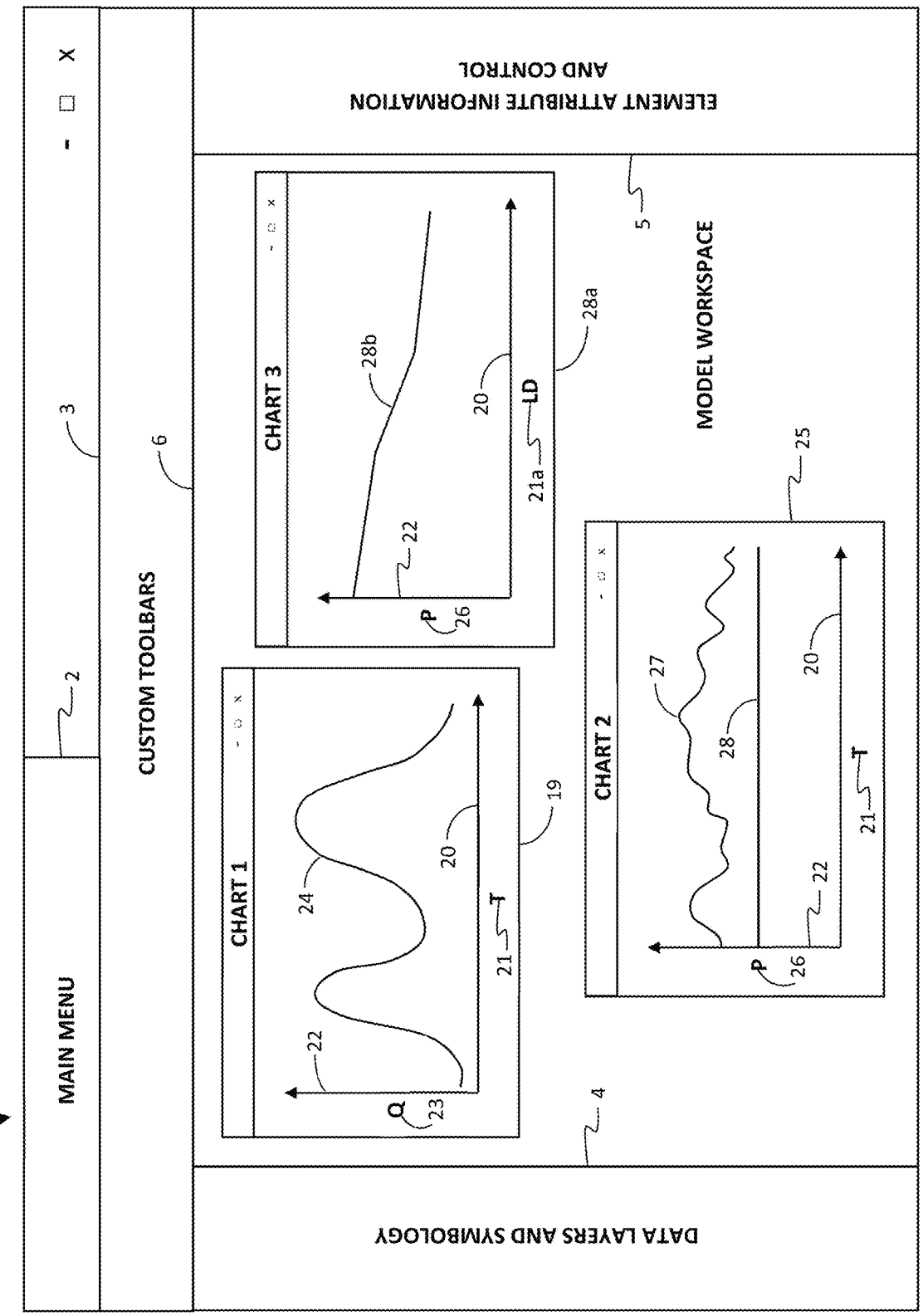
FIG. 2 represents prior art showing a schematic diagram of the same computer screen displaying a hydraulic computational software with charting functions displaying a time series chart of a diurnal water demand of one or a group of nodes in the water distribution network model used for extended period simulation (EPS) modeling, a model output time series chart displaying the upstream and downstream pressures at a control valve element over the EPS simulation, and a hydraulic pressure head profile along a linear path of pipes in the water distribution network model at a specific model run time step during the EPS simulation.

Prior art is shown in FIG. 2, the same computer modeling software screen 1, showing an example chart window (#1) 19, consisting of an x-axis 20 with time scale units (T) 21 and a y-axis 22 with flow (Q) or % of average flow units 23, showing a diurnal water demand pattern 24. Another example chart window (#2) 25, consisting of an x-axis 20 with time scale units (T) 21 and a y-axis 22 with pressure units (P) 26, shows an upstream pressure time series 27 and downstream pressure time series 28 from a pressure reducing valve (PRV) model element 13. Another example chart window (#3) 28a, consisting of an x-axis 20 with units of linear distance along a group of model elements (LD) 21a and a y-axis 22 with pressure units (P) 26, shows the hydraulic pressure profile along the group of model pipe elements 28b.

Prior art is shown in FIG. 3A, a two-gauge method C-factor test for small water mains 29a. The configuration consists of a primary water main 29 below ground 30 with an upstream hydrant 31, downstream hydrant 32, and a flow hydrant 33 which are connected by a hydrant lateral pipe 34. A field technician 35 tests section (L) 36 by closing isolation valves 37 downstream of the flow hydrant 33 and on lateral water mains 38. A field technician 35 installs an upstream pressure gauge 39 at upstream elevation ($Z_U$) 40 and a downstream pressure gauge 41 at downstream elevation ($Z_D$) 42 such that elevation correction must be applied due to the elevation difference ($Z_U-Z_D$) 43 as described herein. A field technician 35 records the upstream static pressure (Pus) 44 and downstream static pressure ($P_{DS}$) 45 while the pipe flow rate (Q) 48 is zero. The next step is a hydrant flow event 46. A field technician 35 records the hydrant flow rate (Q) 47 which equals the pipe flow rate (Q) 48, at which time a second field technician 35 records the upstream residual pressure ($P_{UR}$) 49 and a third field technician 35 records the downstream residual pressure ($P_{DR}$) 50. The resulting C-factor is then calculated as shown in FIG. 3D.

Prior art is shown in FIG. 3B, a parallel-hose method C-factor test for small water mains 29b, which reduces measurement errors compared to the two-gauge method described in FIG. 3A. The configuration and test is performed similarly as described above and shown in FIG. 3A except that a test hose 51 and differential pressure gauge 52 are installed parallel to the primary water main 29 connected to the upstream hydrant 31 and downstream hydrant 32. While this test method provides superior accuracy, it is not practical for very long water main tests as illustrated in FIG. 3C.

Prior art is shown in FIG. 3C, a two-gauge method C-factor test for long or large diameter water mains 29c, which are more difficult to achieve accurate test results due to inaccuracies in the upstream 39 and downstream 41 pressure gauges and because of low pressure differential in the large diameter main 57a, thus a long test section (L>>) 54 is utilized. The configuration and test is performed similarly as described above and shown in FIG. 3A except that a test pit 55 is dug so a field technician 35 can install an insertion rod flowmeter 56 to measure the pipe flow rate (Q) 48 directly. Due to the long test section (L>>) 54, it is sometimes impractical to close the later water mains 38 and thus the isolation valves 37 are left open further reducing the accuracy of the test. The resulting C-factor is then calculated as shown in FIG. 3D.

Prior art is shown in FIG. 3D, the Hazen-Williams pipe internal roughness formula 58 is used to calculate the pipe C-factor coefficient 60, where L equals the test section in linear feet 36 which is 10,560' in this example 62, where Q equals the pipe flow rate 48 in gallons per minute which is 2,100 gpm in this example 63, where $H_{LP}$ equals the pipe head loss 59 in feet of water column which is a very small and difficult to measure 3.5' in this example 66 without ultra-high accuracy elevation data and pressure sensors, and where D equals the pipe internal diameter 57 in inches which is 24" in this example 61. The example C-factor calculation 65 results in a pipe C-factor coefficient 60 of 133 in this example 64.

Figure 4:
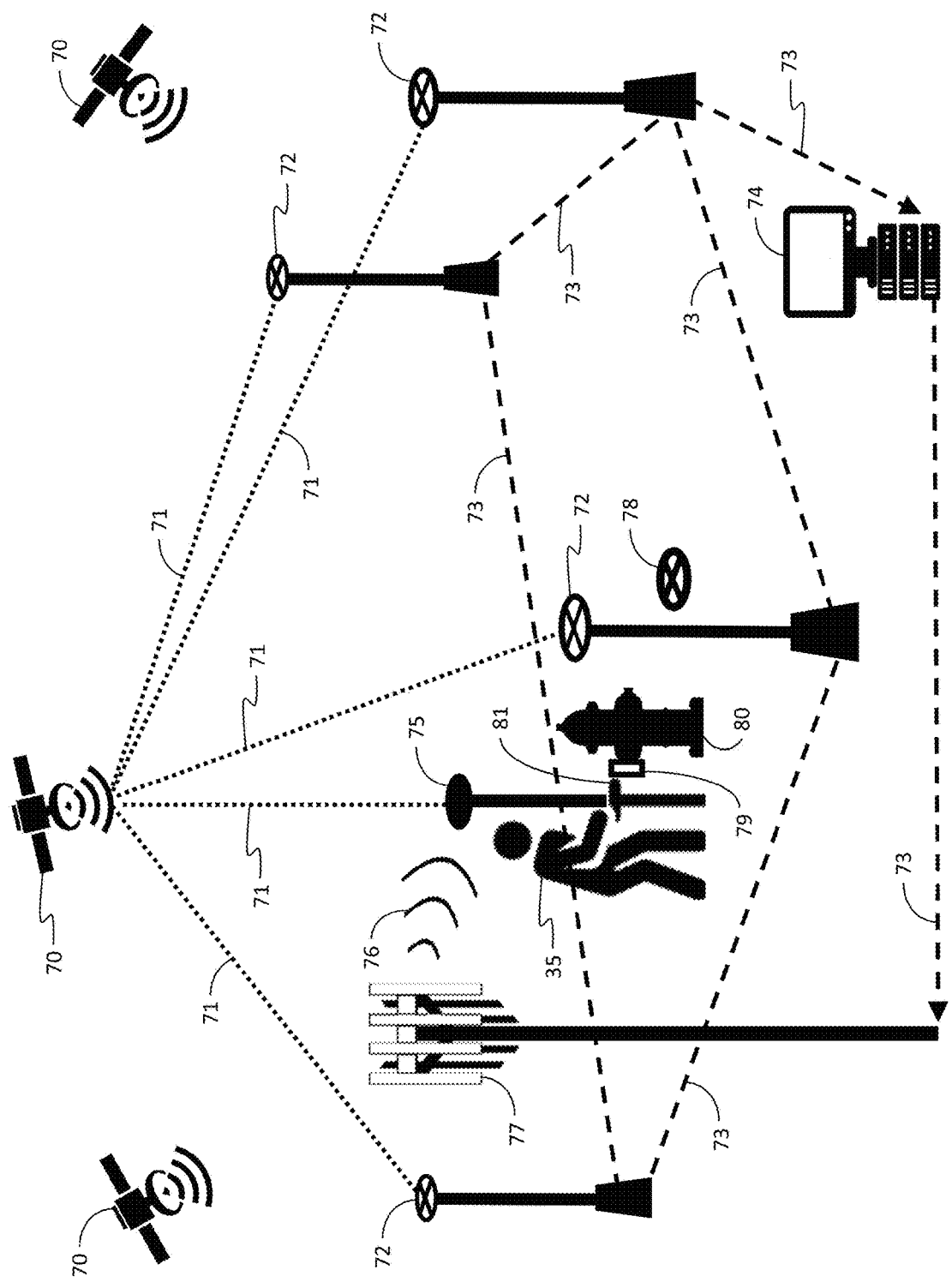
FIG. 4 is a schematic diagram, in isometric view, illustrating an ultra-high accuracy measurement of the elevation of water infrastructure assets using global navigation satellite system (GNSS) static or real-time kinematic (RTK) surveying and deployment of an ultra-high accuracy pressure sensor and telemetry device, in accordance with the present disclosure.

As shown in FIG. 4, one aspect of the real-time system and method for calibrating a water distribution network hydraulic model may be to minimize hydraulic measurement error by using a combination of ultra-high accuracy pressure sensors 79 and real-time kinematic surveying (RTK) 81 to obtain ultra-high accuracy elevation data at a water system connection such as a fire hydrant 80. The Global Navigation Satellite System (GNSS) 70 provide direct satellite communication 71 to fixed earth reference stations 72 which communicate through the internet 73 to a central server 74, and a rover station 75 communicates its position over cellular communication 76 to a local cell tower 77 back to the central server 74. The coordinates of a virtual reference station 78 are then communicated back to the rover station 75 at the field technician 35 location. The accuracy of the horizontal elevation measurements is typically less than 1-inch referenced to mean sea level.

As shown in FIG. 5, one aspect of the real-time system and method for calibrating a water distribution network hydraulic model may be an above-ground ultra-high accuracy pressure telemetry station 82 connected to a fire hydrant 80 which is connected to a hydrant lateral pipe 34 and to a primary water main 29 below ground 30, and a below-ground ultra-high accuracy pressure telemetry station 83 is connected to a water piping appurtenance 84 which is connected to a lateral water main 38 and to a primary water main 29. A telemetry unit 85 collects data from the ultra-high accuracy pressure sensor 79 and transmits the data via cellular communication 76 to a cell tower 77 where it is transmitted via the internet 73 to a on-premise computer server and data storage 87 or cloud server and data storage 88 where data is retrieved on desktop computers 89 and mobile devices 90. Remote commands can be transmitted in reverse to telemetry unit 85 for output control or setting changes. In combination, ultra-high accuracy pressure sensor 79 and telemetry unit 85 may be best understood as a field device to transmit to a computing device up-to-the-second readings of real-time pressure, or sending real-time pressure values as field device data to be used by the system to accurately simulate the hydraulic piping network.

As shown in FIG. 6A, one aspect of the real-time system and method for calibrating a water distribution network hydraulic model may be an above-ground ultra-high accuracy pressure telemetry station 82 which is connected to a fire hydrant 80, consisting of a hydrant telemetry barrel-type enclosure 91, a solar panel 92, an enclosure base 93 connected to the ground 30 using stakes 94. The solar panel 92 and barrel-type enclosure 91 are coupled together allowing the pair to swivel 95 toward the sun. The ultra-high accuracy pressure sensor 79 and telemetry unit 85 may be coupled together and connected to a hydrant nozzle 101 or they may be separate components having a telemetry unit 85 fixed to the body of the fire hydrant 80 and the ultra-high accuracy pressure sensor 79 connected to a 3-port, 2-way latching solenoid 96 which is connected to a hydrant nozzle adapter 97. Separately a drain pipe 98 and 2-port, 2-way latching solenoid 99 may be used to release water at hydrant flow event 46 from the fire hydrant 80 using control signal wire 100 from the telemetry unit 85 (or telemetry unit controller) which can transmit and receive commands via cellular communication 76. To further protect from temperature variations which can negatively impact sensor accuracy, the hydrant telemetry barrel-type enclosure 91 includes a layer of insulation 102 which also protects during short duration freezing or hot temperatures.

Figure 6C:
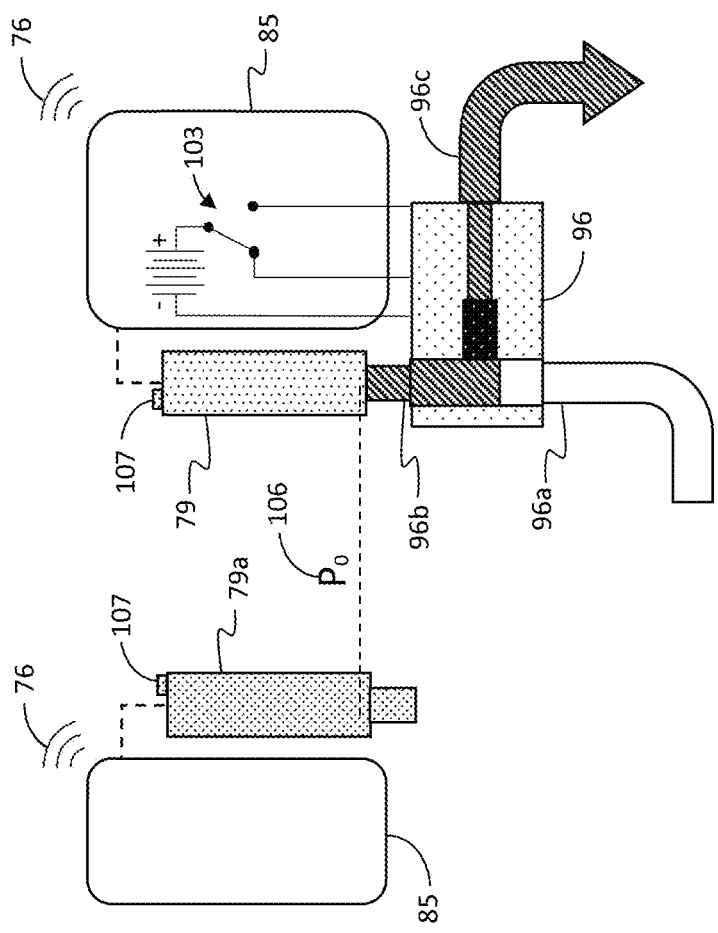
FIG. 6C is a section view of two apparatuses, in accordance with the present disclosure, including the same telemetry unit, 3-port 2-way latching solenoid, a high range ultra-high accuracy absolute pressure sensor, and control circuit described in FIG. 6B, but the control circuit is directing the 2-way port direction to de-pressurize the sensor to atmospheric pressure for "zero" calibration adjustment. The second apparatus is a calibration reference, ultra-high accuracy pressure sensor/telemetry unit, also of absolute type, but with a lower barometric pressure range used to remotely compare and calibrate the high-range sensor when vented to atmosphere.
Figure 6B:
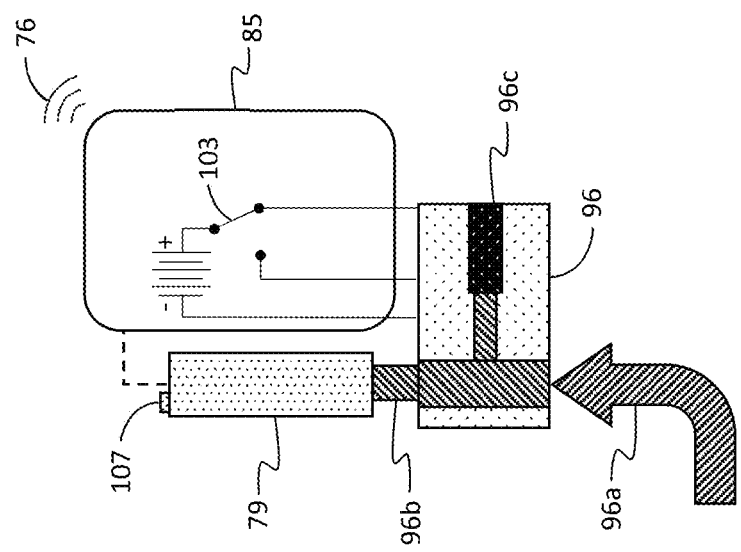
FIG. 6B is a section view of an apparatus, in accordance with the present disclosure, including a telemetry unit, a 3-port 2-way latching solenoid, a high-range ultra-high accuracy pressure sensor of absolute type, which avoids measurement error due to weather related barometric pressure changes, and a control circuit that is directing the 2-way port direction to pressurize the sensor.

As shown in FIG. 6B, one aspect of the real-time system and method for calibrating a water distribution network hydraulic model may be a 3-port, 2-way latching solenoid 96 with water supply port 96a, pressure sensor port 96b, and vent-to-atmosphere port 96c. The control circuit 103 within the telemetry unit 85 provides a short duration pulse to the solenoid 96 to pressurize the ultra-high accuracy pressure sensor 79, which is an absolute-type using a plug 107 and vacuum pressure induced on the back side of sensor diaphragm to ensure that barometric pressure changes from diurnal weather patterns do not induce error in the absolute pressure measurements.

As shown in FIG. 6C, one aspect of the real-time system and method for calibrating a water distribution network hydraulic model shows the control circuit 103 changing the mechanical configuration of the 3-port, 2-way solenoid 96 so that water supply port 96a is isolated, and the pressure sensor port 96b is depressurized and water drains out the vent-to-atmosphere port 96c. During this time, a portable or fixed reference-grade barometric pressure sensor 79a (barometer) and telemetry unit 85 can be used to measure the atmospheric pressure ($P_O$) 106 for comparing against and calibrating the primary ultra-high accuracy pressure sensor 79 to correct the typical "zero" drift.

Prior art is shown in FIG. 7A, a typical model pipe and junction element configuration 110, with model pipe elements 7 and junction elements 8 where the primary pipe has length ($L_T$) 111.

As shown in FIG. 7B, one aspect of the real-time system and method for calibrating a water distribution network hydraulic model is a configuration of opposing virtual PRV elements 112, with the model pipe element 7 as a deactivated pipe element 15, two opposing virtual PRV elements 113, four virtual PRV pipe elements 114 with length ($L_T/2$) 116, two virtual PRV check valve elements 115 and showing the corresponding pipe element flow direction symbology 18. The two, opposing virtual PRV elements 113 are initially populated with ultra-high accuracy vertical elevation data from RTK surveying 81 and continuously from data gathered from ultra-high accuracy pressure sensor 79 via an on-premise server and data storage 87 or cloud server and data storage 88.

As shown in FIG. 7C, one aspect of the real-time system and method for calibrating a water distribution network hydraulic model shows a bi-directional virtual PRV element configuration 117, which provides the same functionality of the configuration shown in FIG. 7B, but consists of a single bi-directional virtual PRV element 118 with embedded software code to mimic two opposing virtual PRV model elements 113 and virtual check valves 115, allowing pressure control in either flow direction based on local governing hydraulics of the model simulation, resulting in a virtual PRV minor loss, $H_{LM}$ 153, which can be used as an optimization variable during the computer model calibration exercise, whether using manual, genetic algorithm, or other advance machine learning techniques.

Figure 8A:
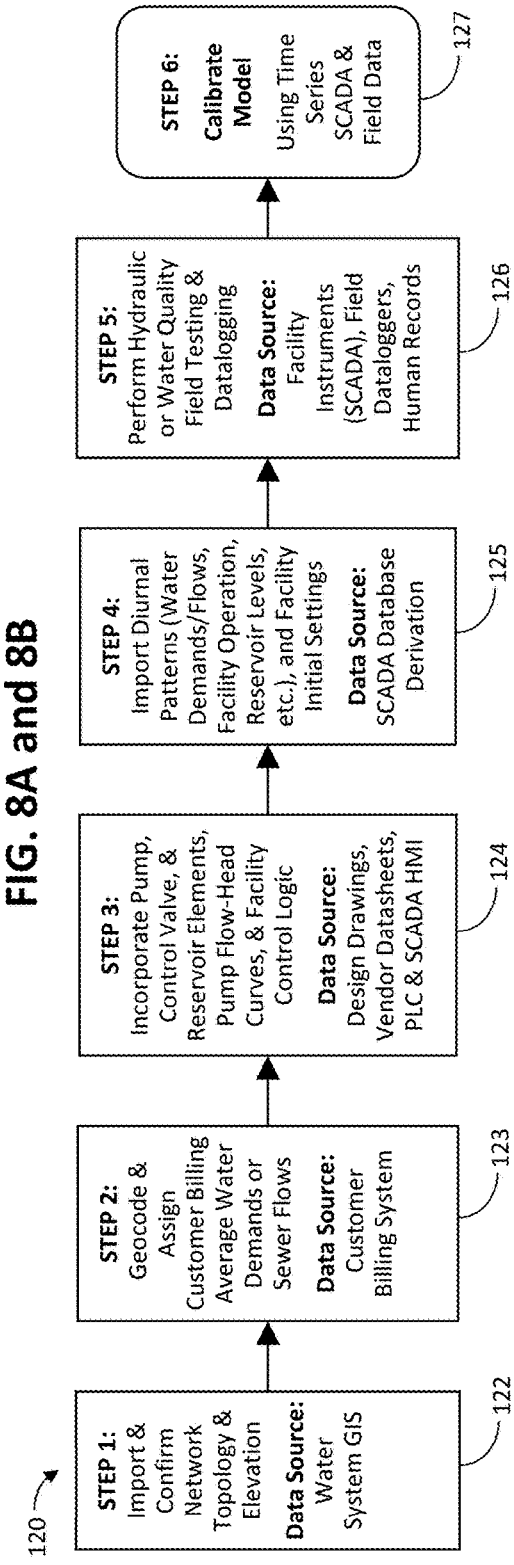
FIG. 8A, representing prior art, is a block diagram illustrating the traditional steps of preparing a water distribution system network model for calibration as a single event which typical occurs every 5 to 10 years.

Prior art is shown in FIG. 8A, where Sequence A shows the steps of a traditional hydraulic model preparation for a single event manual calibration effort 120. Step 1 consists of importing network elements and elevation data from a geographical information system (GIS) 122. Step 2 consists of spatially assigning averaged water consumption data using customer billing data 123. Step 3 consists of incorporating physical and logical operational data for facilities 124. Step 4 consists of importing diurnal water demand and facility operational patterns 125. Step 5 consists of performing manual field tests and collecting operational data using temporary dataloggers and/or from the Supervisory Control and Data Acquisition (SCADA) historian database 126. And the final step consists of calibrating the model to the manual, field datalogger, and SCADA time series data 127, as one does who is experienced in the art of calibrating water distribution network computer models.

Figure 8B:
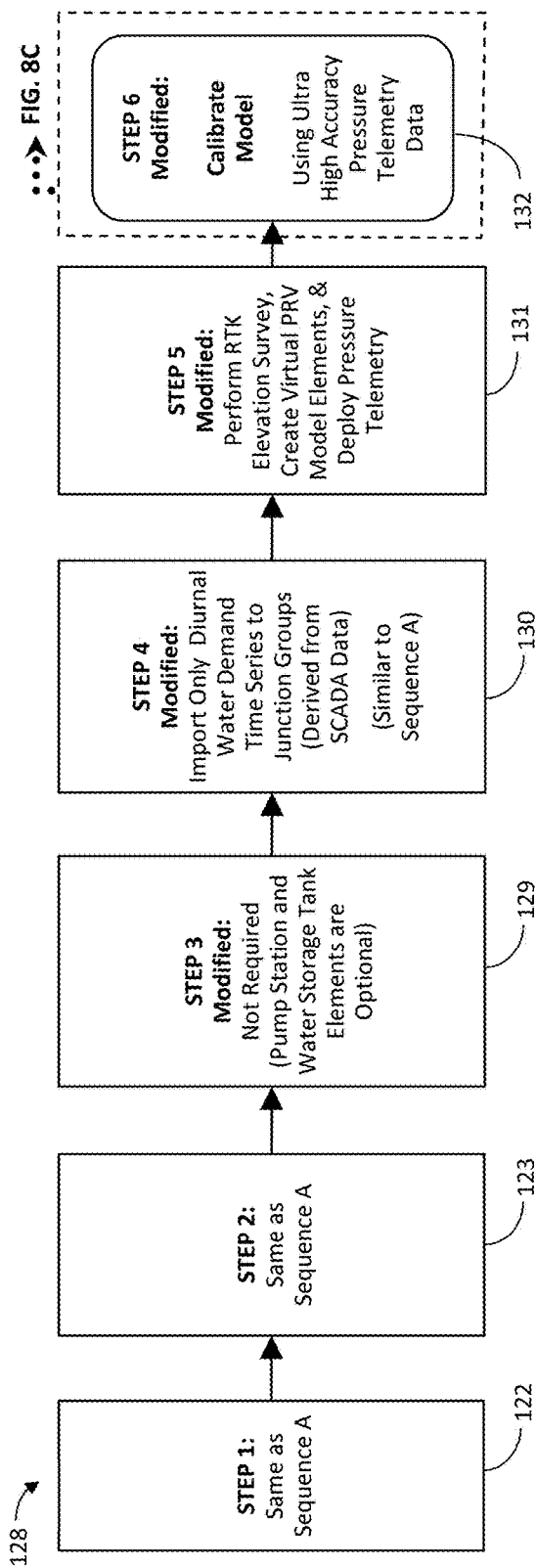
FIG. 8B, in accordance with the present disclosure, is a block diagram showing a simplified model preparation for automatic and continuous calibration using ultra-high accuracy elevation and pressure telemetry data.

As shown in FIG. 8B, one aspect of the real-time system and method for calibrating a water distribution network hydraulic model shows Sequence B—a simplified model preparation for an automatic and continuous calibration system 128. Step 1 122 and Step 2 123 are the same as Sequence A of FIG. 8A, while Step 3 (Modified) 129 includes adding pump station and storage tank model elements which can be delayed to a later date or skipped altogether. Step 4 (Modified) 130 only requires importing historical diurnal water demand patterns to junction element groups. Step 5 (Modified) 131 consists of deploying above-ground ultra-high accuracy pressure telemetry stations 82, and below-ground ultra-high accuracy pressure telemetry stations 83, and configuring virtual PRV model elements 113 or 118. Step 6 (Modified) 132 consists of importing ultra-high accuracy pressure telemetry data to perform near real-time automatic and continuous model calibration per FIG. 8C.

As shown in FIG. 8C, one aspect of the real-time system and method for calibrating a water distribution network hydraulic model shows a continuation of Sequence B—the near real-time automatic and continuous calibration of a water distribution network computer model 132. Step A 133 consists of modifying the C-factors for a group of pipes or keeping the previously populated values. Step B 134 consists of modifying the open or close status of one or more model pipes within a group of pipes, to simulate inadvertent closed valves in the real water distribution system, or keeping the previously populated open or close status. Step C 135 consists of modifying the water demand magnitude of a single model run time step for the extended period simulation (EPS) model or keeping the previous water demand values. Steps A, B, and C can be modified in any order as desired. Step D 136 consists of performing the computer model simulation at a single time step. Step E 137 consists of evaluating whether the minor losses of a designated group of virtual PRVs exceeds a calibration setpoint value or is equal to zero. If YES 138, the computer optimization algorithm proceeds with a new calibration iteration by varying newly or predefined settings in Step A, B, and C until the virtual PRV minor losses are greater than zero but less than the designated setpoint. When NO 139, the computer optimization algorithm proceeds to the next computer model simulation time step utilizing the corresponding ultra-high accuracy pressure telemetry data. If all the specified model run time steps are complete, then STOP the calibration optimization 139a.

Figure 9:
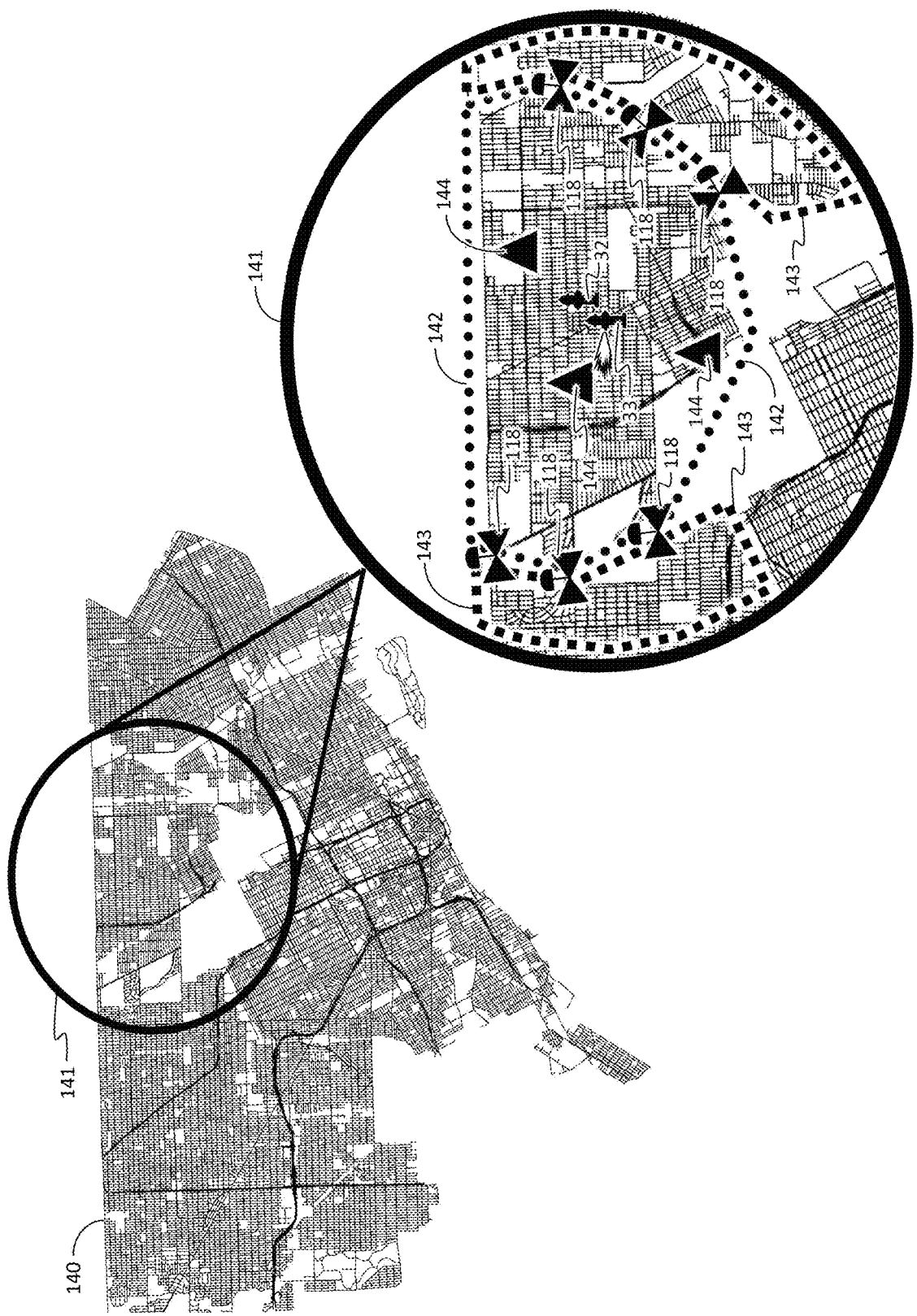
FIG. 9, in accordance with the present disclosure, is a plan view illustrating a public water distribution network covering a large geographic area and illustrating an example virtual pressure zone (VPZ) using a strategic placement of ultra-high accuracy pressure sensors/wireless telemetry that provide real-time data inputs for the virtual PRV model elements.

As shown in FIG. 9, one aspect of the real-time system and method for calibrating a water distribution network hydraulic model shows a plan view of a water distribution model 140 and how it might appear in a computer modeling software screen 1. An example virtual pressure zone 141 area is highlighted with multiple bi-directional virtual PRV elements 118, with a designated downstream area of hydraulic influence 142 and designated upstream area of hydraulic influence 143. Several pressure telemetry verification points 144 are included for calibration verification. Also shown are representation of a downstream hydrant 32 and flow hydrant 33.

Figure 10:
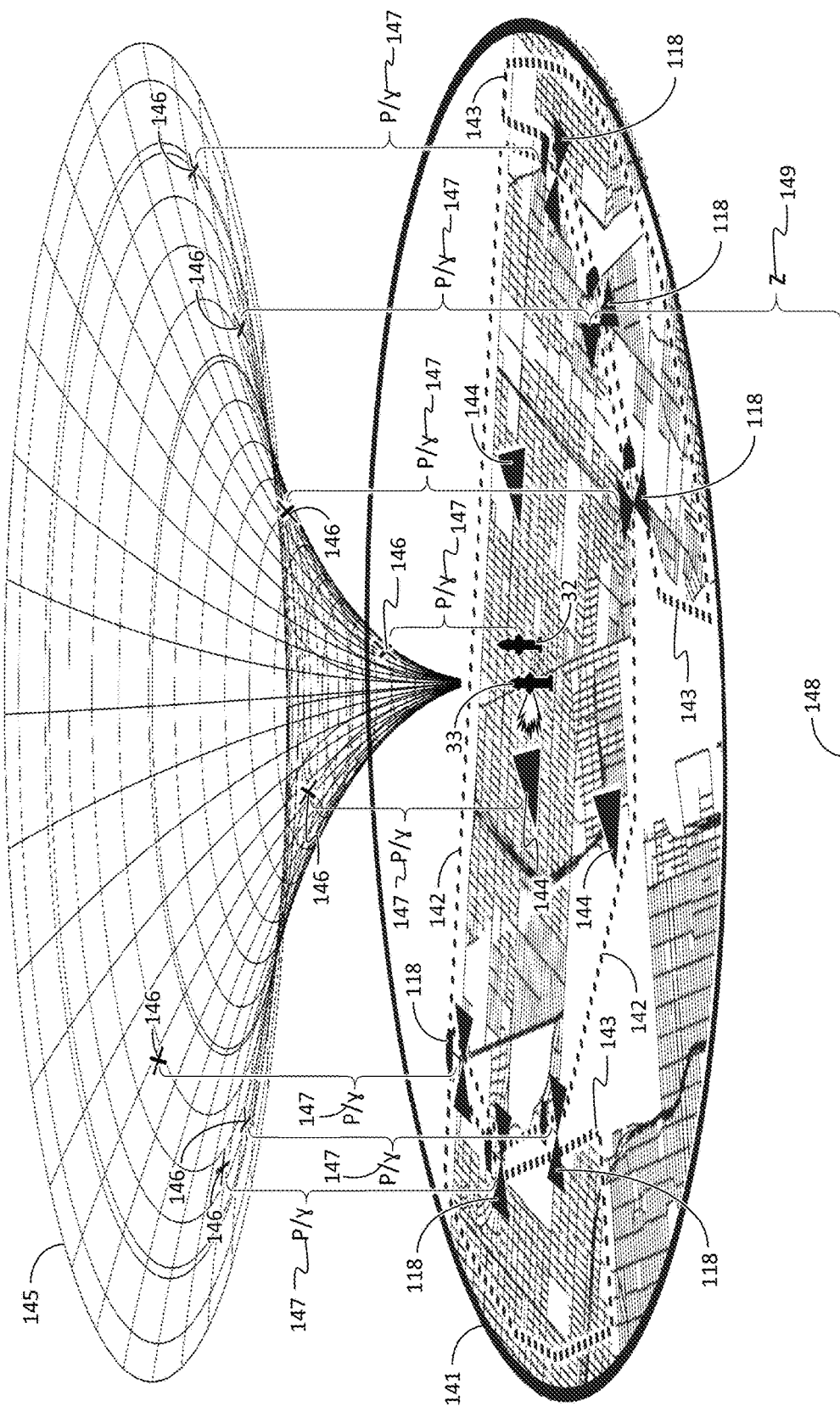
FIG. 10, in accordance with the present disclosure, is a schematic diagram, in isometric view, illustrating the virtual pressure zone (VPZ) area of FIG. 9 with a 3-dimensional hydraulic gradient surface produced by a fire hydrant flow test or other high flow event, where the virtual PRVs control the model hydraulic gradient even though the high flow event is not captured by any telemetry system.

As shown in FIG. 10, one aspect of the real-time system and method for calibrating a water distribution network hydraulic model shows the virtual pressure zone 141 from FIG. 9 in an isometric view. A 3-dimensional hydraulic gradient surface 145 is shown representing the effect of a flow hydrant 33 being open. The bi-direction virtual PRV model element 118 is at elevation (z) 149 above mean sea level 148. The corresponding field sensor pressure P divided by the unit weight of water γ is the pressure head (P/γ) 147, where z+P/γ equals the field sensor hydraulic gradient 146 which is controlled by the bi-directional virtual PRV model element 118 allowing the model to automatically adjust to large water demand changes which may not be collected by a telemetry system.

Figure 11:
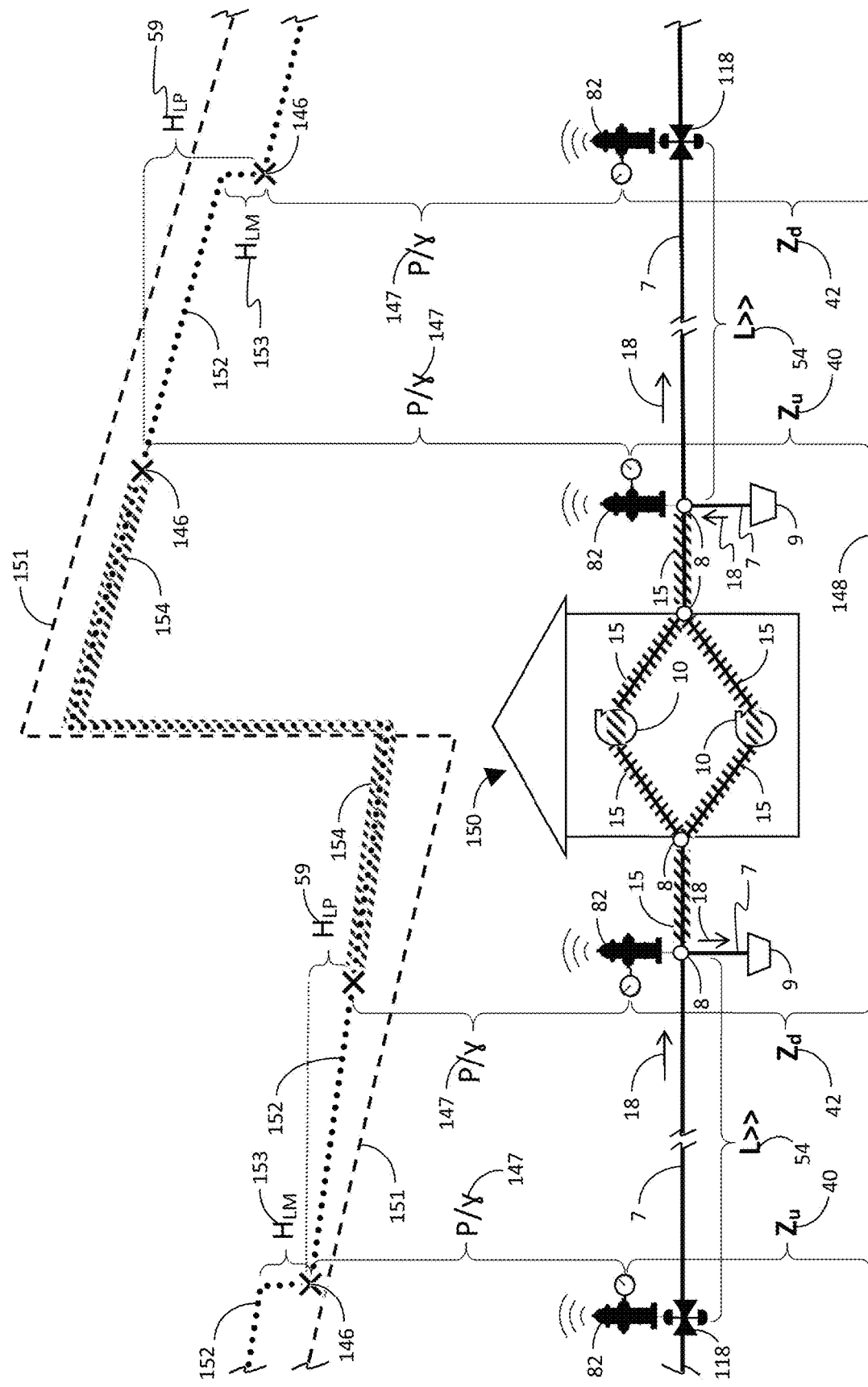
FIG. 11, in accordance with the present disclosure, is an elevation and schematic diagram illustrating a model view of water booster pumping station and buried water distribution network piping with strategic placement of ultra-high accuracy pressure sensors and wireless telemetry that define local and global model boundary conditions providing the ability to deactivate the model pump elements, thus simplifying the real-time model development effort.

As shown in FIG. 11, one aspect of the real-time system and method for calibrating a water distribution network hydraulic model shows a water booster pumping station 150 representation in a model of a water booster pumping station 150 in profile view with a model pipe elements 7 (e.g. represented here as a water main) upstream and downstream. To simplify the real-time modeling process, an aboveground ultra-high accuracy pressure telemetry station 82 is placed at each end of very long test sections (L>>) 54 allowing the more complicated facility pump model elements 10 and associated pipes to be deactivated, or become deactivated pipe element 15. The fully active uncalibrated model has a hydraulic gradient profile 151 where the portion at the pump station 150 does not need to be determined 154 using one aspect of the real-time system and method for calibrating a water distribution network hydraulic model. Virtual reservoir model elements 9 are placed at each side of the water booster pumping station 150 to serve as a sink and source, both using head patterns controlled by the ultra-high accuracy pressure sensor 79 time series data. The calibrated hydraulic gradient profile 152 and corresponding field pressure sensor hydraulic gradients 146 are imported to the bi-direction virtual PRV model elements 118 and virtual reservoir model elements 9. Calibration is achieved when the bidirectional virtual PRV minor loss ($H_{LM}$) 153 is iteratively reduced below a user specified setpoint and above zero. The true head loss of the pipe is ($H_{LP}$) 59.

Figure 12:
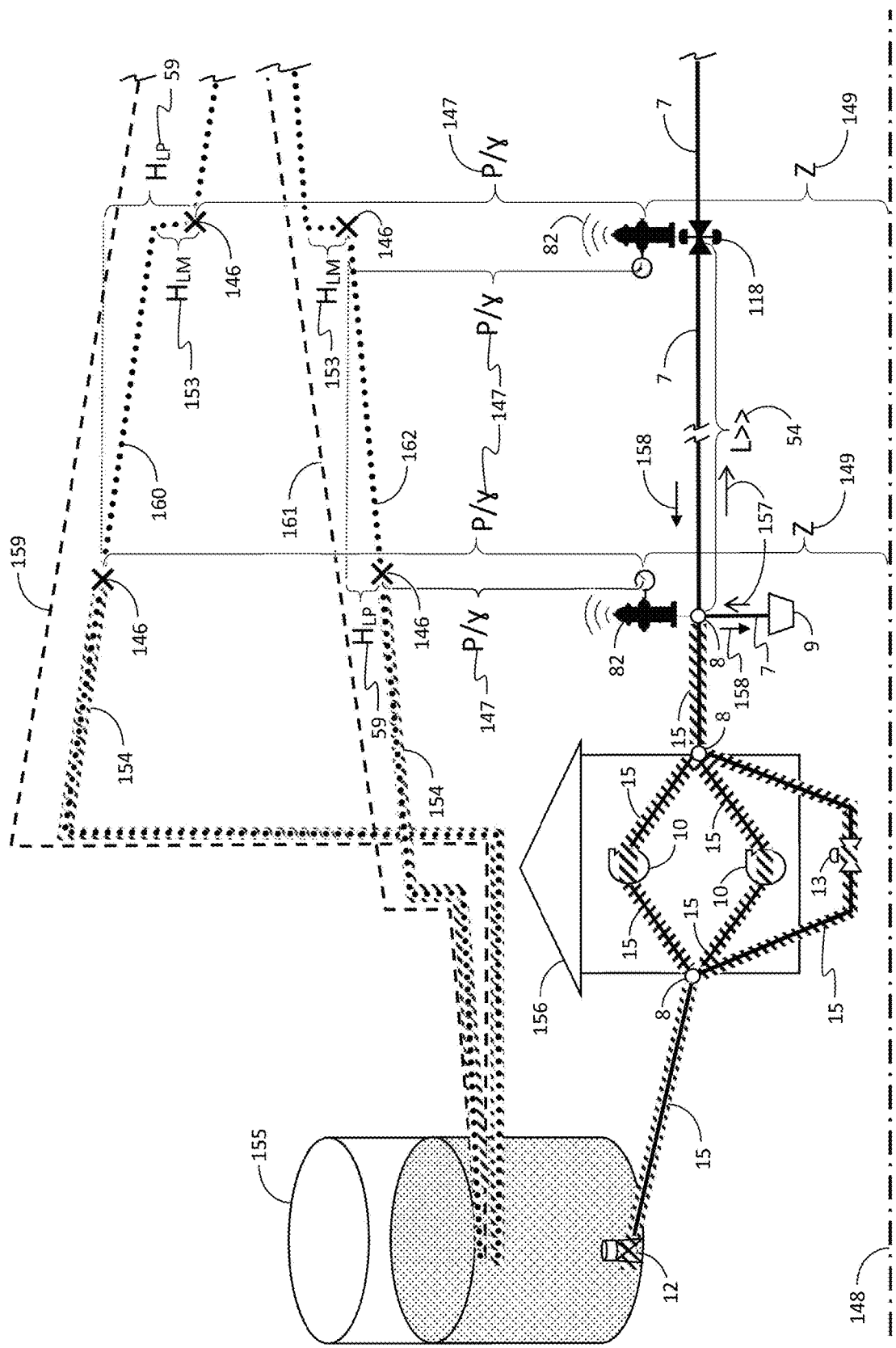
FIG. 12, in accordance with the present disclosure, is an elevation and schematic diagram illustrating a model view of a ground storage tank and re-pumping station with strategic placement of ultra-high accuracy pressure sensors and wireless telemetry that define local and global model boundary conditions and provide the ability to deactivate the model pump, tank fill control valve, and storage tank elements, thus simplifying the real-time model development effort.

As shown in FIG. 12, one aspect of the real-time system and method for calibrating a water distribution network hydraulic model shows a ground storage tank 155 and re-pump station 156 representation in a model in profile view. To simplify the real-time modeling process, an aboveground ultra-high accuracy pressure telemetry station 82 is placed at each end of very long test sections (L>>) 54 allowing the more complicated facility pump model elements 10, water storage tank model element 12, pressure reducing valve model elements 13 and associated pipes to be deactivated, thereby transitioning to deactivated pipe element 15. The fully active uncalibrated model has a forward hydraulic gradient profile 159 when pumping and a backward hydraulic gradient profile 161 during tank fill cycles, and a portion that does not need to be determined 154 using one aspect of the real-time system and method for calibrating a water distribution network hydraulic model. A virtual reservoir model element 9 is placed on the downstream side of re-pump station 156 (or water booster pumping station 150) to serve as a sink and source both using head patterns controlled by the ultra-high accuracy pressure sensor 79 time series data. The calibrated hydraulic gradient profile 160, 162 and corresponding field pressure sensor hydraulic gradients 146 are imported to the bi-direction virtual PRV model element 118 and virtual reservoir model element 9. Calibration is achieved when the bidirectional virtual PRV minor loss ($H_{LM}$) 153 is iteratively reduced below a user specified setpoint and above zero. The true head loss of the pipe is ($H_{LP}$) 59.

Figure 13:
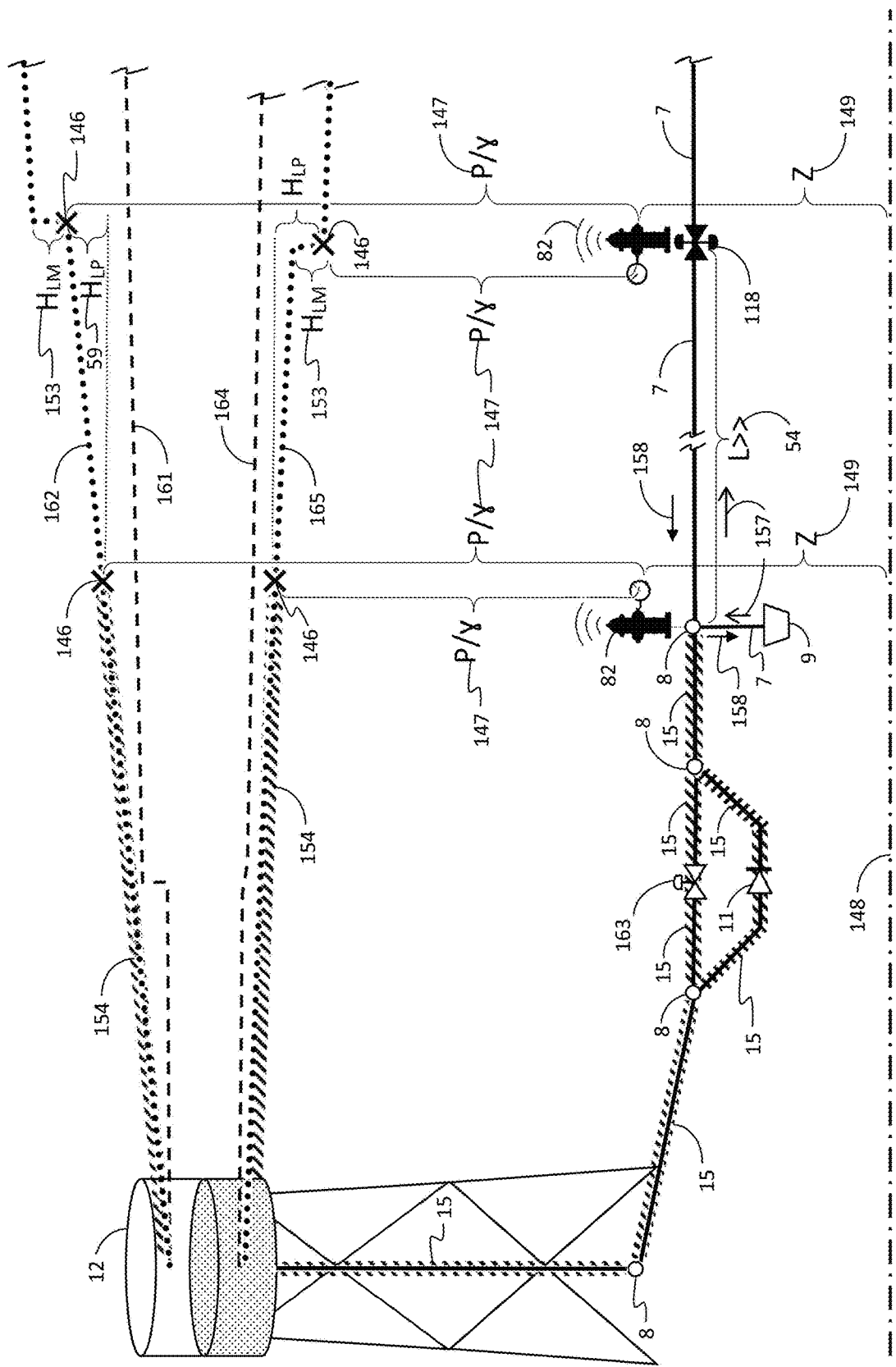
FIG. 13, in accordance with the present disclosure, is an elevation and schematic diagram illustrating an elevated water storage tank with altitude control and check valves plus a strategic placement of ultra-high accuracy pressure sensors and wireless telemetry that define local and global model boundary conditions and ability to deactivate the model tank and control valve elements, thus simplifying the real-time model development effort.

As shown in FIG. 13, one aspect of the real-time system and method for calibrating a water distribution network hydraulic model shows an elevated water storage tank model element 12 and tank control valve model element 163 and check valve model element 11 represented in a model profile view. To simplify the real-time modeling process, an aboveground ultra-high accuracy pressure telemetry station 82 is placed at each end of very long test sections (L>>) 54 allowing the more complicated elevated water storage tank model element 12 and tank control valve model elements 163 and associated pipes to be deactivated 15. The fully active uncalibrated model has a forward hydraulic gradient profile 164 when the water storage tank model element 12 is draining and a backward hydraulic gradient profile 161 when the water storage tank model element 12 is filling, a portion which does not need to be determined 154 using one aspect of the real-time system and method for calibrating a water distribution network hydraulic model. A virtual reservoir model element 9 is placed on the downstream side of the tank control valve model element 163 to serve as a sink and source both using head patterns controlled by the ultra-high accuracy pressure sensor 79 time series data. The calibrated hydraulic gradient profile 161, 165 and corresponding field pressure sensor hydraulic gradients 146 are imported to the bi-direction virtual PRV model element 118 and virtual reservoir model element 9. Calibration is achieved when the bidirectional virtual PRV minor loss ($H_{LM}$) 153 is iteratively reduced below a user specified setpoint and above zero. The true head loss of the pipe is ($H_{LP}$) 59.

It is herein contemplated that bi-directional pressure reducing valve (PRV) model element 13 as well as related virtualized elements, data, and/or calculations associated therewith, all lacking physical structure, may in fact be represented and/or analogized by other virtual elements, associated data and/or calculations. One skilled in the art would know to substitute various other virtualized hydraulic elements, which may be by way of example and not limitation a reservoir element. Importantly, substitutions for pressure reducing valve (PRV) model element 13 may have the capability to add pressure and/or volume to the simulated model and/or subtract pressure and/or volume to the simulated model at a spatially relevant point to the user and/or simulation.

The foregoing description and drawings comprise illustrative embodiments. Having thus described exemplary embodiments, it should be noted by those skilled in the art that the within disclosures are exemplary only, and that various other alternatives, adaptations, and modifications may be made within the scope of the present disclosure. Merely listing or numbering the steps of a method in a certain order does not constitute any limitation on the order of the steps of that method. Many modifications and other embodiments will come to mind to one skilled in the art to which this disclosure pertains having the benefit of the teachings presented in the foregoing descriptions and the associated drawings. Although specific terms may be employed herein, they are used in a generic and descriptive sense only and not for purposes of limitation. Accordingly, the present disclosure is not limited to the specific embodiments illustrated herein, but is limited only by the following claims.

What is claimed is:

1. A system for generating and calibrating a hydraulic piping network computer simulation model based on a real-time field hydraulic information from a physical hydraulic piping network in order to establish a real-time hydraulic network simulation model, the system comprising:
    a computing device having a processor, a memory, and a non-transitory computer readable medium, the computing device connected to a computing network and configured to:
        store a field hydraulic data on said non-transitory computer readable medium;
        receive an at least one real-time field hydraulic data from a plurality of field devices via said computing network;

simulate the physical hydraulic piping network according to said field hydraulic data and said real-time field hydraulic data via said processor, thereby generating the hydraulic piping network computer simulation model; and locate, within the hydraulic piping network computer simulation model, an at least one bi-directional virtual pressure reducing valve having a hydraulic pressure data value, said at least one bi-directional virtual pressure reducing valve not associated with a physical piping valve within the physical hydraulic piping network, said hydraulic pressure data value is assigned to force a downstream virtual pressure value to reduce a local pressure error of the hydraulic piping network simulation model;

each of said plurality of field devices with a known ultra-high accuracy elevation and a known barometric pressure, each of said plurality of field devices comprising:

an ultra-high accuracy pressure sensor configured to obtain a hydraulic pressure measurement at an at least one location in the physical hydraulic piping network; and a transmitter configured to transmit a field device data, said field device data comprising at least said hydraulic pressure data to said computing device via said computing network;

wherein said computing device upon receipt of said field device data is further configured to assign said hydraulic pressure data value to said bi-directional virtual pressure reducing valve to generate the real-time hydraulic network simulation model.

2. The system of claim 1, wherein the physical hydraulic piping network is an at least one hydraulic network type, said at least one hydraulic network type is selected from a group of hydraulic network types consisting of a potable water distribution system, a sanitary sewer collection system, a stormwater collection system, and a combined sanitary-stormwater collection system.

3. The system of claim 1, wherein the known ultra-high accuracy elevation is obtained using a high-accuracy elevation data gathering technique, said high-accuracy elevation data gathering technique is a global navigation satellite system (GNSS) precision augmentation surveying technique.

4. The system of claim 3, wherein the hydraulic piping network computer simulation model further comprises a plurality of system attributes, said plurality of system attributes comprising a plurality of C-factors associated with a plurality of pipes within the physical hydraulic piping network, a water demand associated with a plurality of junctions within an area of the physical hydraulic piping network, and a plurality of hydraulic valve status settings within an area of the physical hydraulic piping network.

5. The system of claim 4, wherein the computing device is configured to simulate said at least one bi-directional virtual pressure reducing valve to force a downstream simulated pressure to match the field device data.

6. The system of claim 5, wherein the computing device is further configured to, using the processor, iteratively adjust an at least one of the system attributes from the plurality of system attributes to minimize a differential pressure across the at least one bi-directional virtual pressure reducing valve.

7. The system of claim 1, wherein the ultra-high accuracy pressure sensor is connected to a fire hydrant.

8. The system of claim 7, further comprising a hydrant enclosure having an interior compartment sufficient to enclose the fire hydrant and cover the fire hydrant from view, coupled atop said hydrant enclosure is a photovoltaic power supply, one or more of said hydrant enclosure.

9. The system of claim 1, wherein the ultra-high accuracy pressure sensor is an absolute-type having a sealed-port and induced vacuum between an internal sensor element and a sealed port.

10. The system of claim 9, wherein the plurality of field devices each having the ultra-high accuracy pressure sensor further comprises a multi-port solenoid valve, said multi-port solenoid valve having at least a high pressure position and an atmospheric pressure position, said high pressure position pressurizes the sensor on a hydraulic side of said multi-port solenoid valve to obtain a hydraulic pressure value and said atmospheric position depressurizes said multi-port solenoid valve to an atmospheric side to obtain a barometric pressure value, thereby allowing for a local zero calibration adjustment or a remote zero calibration adjustment based upon a reference barometric pressure field device.

11. The system of claim 1, further comprising a plurality of additional sensors, said plurality of additional sensors comprising an at least one flow sensor, an at least one level sensor, and an at least one water quality sensor within the physical hydraulic piping network, each of said plurality of additional sensors connected to a device to transmit a sensor data to said computing device via said computing network.

12. A method of calibrating a hydraulic network simulation model of a physical hydraulic piping network based on a real-time field hydraulic network information, the method comprising:

Simulating on a computing device having a processor, a memory, and a non-transitory computer readable medium, the computing device connected to a computing network, a plurality of hydraulic network components by calculating a plurality of expected flows and pressures within the hydraulic network, thereby establishing the hydraulic network simulation model;

inputting into the hydraulic network simulation model a first high-accuracy elevation value associated with a first hydraulic measurement connection and a second high-accuracy elevation value associated with a second hydraulic measurement connection, said first and said second hydraulic connections within the physical hydraulic piping network, and assigning said first and said second high accuracy elevation values to a first corresponding point and a second corresponding point in the hydraulic network simulation model;

spatially assigning an averaged and normalized water consumption data based upon a multiple customer usage and locations data from a billing database to said at least one simulated junction element group, said at least one simulated junction element group associated with a plurality of customer billing flow meters;

importing into the hydraulic network simulation model a plurality of system attributes corresponding to said at least one piping element group and said plurality of customer billing flow meters;

installing on said first hydraulic measurement connection a first ultra-high accuracy pressure telemetry device and on said second hydraulic measurement connection a second ultra-high accuracy pressure telemetry device, each of said first and said second ultra-high accuracy pressure devices having a hydraulic pressure value;

transmitting said hydraulic pressure value to said computing device via said computing network; and locating, within the hydraulic piping network computer simulation model, an at least one bi-directional virtual pressure reducing valve having a hydraulic pressure data value, said at least one bi-directional virtual pressure reducing valve not associated with a physical piping valve within the physical hydraulic piping network, said hydraulic pressure data value is assigned to force a downstream virtual pressure value to reduce a local pressure error of the hydraulic piping network simulation model.

13. The method of claim 12, wherein the physical hydraulic piping network is an at least one hydraulic network type, said at least one hydraulic network type is selected from a group of hydraulic network types consisting of a potable water distribution system, a sanitary sewer collection system, a stormwater collection system, and a combined sanitary-stormwater collection system.

14. The method of claim 13, further comprising obtaining the first and the second high-accuracy elevation value using a global navigation satellite system (GNSS) precision augmentation surveying technique.

15. The method of claim 14, wherein the plurality of system attributes comprises a plurality of C-factors associated with a plurality of pipes within the physical hydraulic piping network, a water demand associated with a plurality of junctions within an area of the physical hydraulic piping network, and a plurality of hydraulic valve status settings associated with a plurality of pipes within the physical hydraulic piping network.

16. The method of claim 15, further comprising, at the computing device, receiving from a first ultra-high accuracy pressure telemetry device a first hydraulic pressure value and a second ultra-high accuracy pressure telemetry device a second hydraulic pressure value, and generating on the hydraulic network simulation model an at least one bi-directional virtual pressure reducing valve having a virtual pressure value, said at least one bi-directional virtual pressure reducing valve not associated with a physical piping valve within the physical hydraulic piping network, and configuring said computing device to simulate a change in the system attributes based upon at least one of said first and said second bi-directional virtual pressure reducing value forcing a simulated pressure to match said first and said second hydraulic pressure values.

17. The method of claim 16, further comprising configuring the hydraulic network simulation model to iteratively adjust an at least one system attribute from a group of system attributes, the group of input variables consisting of a plurality of pipe C-factors, a plurality of pipe open or close statuses, or a plurality of junction water demands, until a designated pressure differential range is achieved at the at least one bi-directional virtual pressure reducing valve.

18. The method of claim 12, wherein at least one of the first and the second ultra-high accuracy pressure sensors is connected to a fire hydrant.

19. The method of claim 18, further comprising installing a hydrant enclosure, said hydrant enclosure capable of covering the fire hydrant from view, and coupling atop said fire hydrant enclosure a photovoltaic power supply, one or more of said fire hydrant enclosure and said photovoltaic power supply capable of rotating to maximize solar efficiency and to sufficiently power the field device by rotating said hydrant enclosure.

20. The method of claim 12, wherein the first and second ultra-high accuracy pressure sensors are an absolute-type having a sealed-port and an induced vacuum between an internal sensor element and a sealed port, said multi-port solenoid valve having at least a high pressure position and an atmospheric position, and further comprising the steps of:

pressurizing said high pressure position to obtain a hydraulic pressure value;

depressurizing said atmospheric position capable on an atmospheric side to obtain a barometric pressure value; and allowing for a local zero calibration adjustment or a remote zero calibration adjustment based upon a reference barometric pressure field device.

* * * * *